(12) United States Patent
Sugawara

(10) Patent No.: US 7,476,471 B2
(45) Date of Patent: Jan. 13, 2009

(54) METHOD FOR CORRECTING MASK PATTERN, EXPOSURE MASK, AND MASK PRODUCING METHOD

(75) Inventor: Minoru Sugawara, Kanagawa (JP)

(73) Assignee: Sony Corporation, Tokyo (JP)

( * ) Notice: Subject to any disclaimer, the term of this patent is extended or adjusted under 35 U.S.C. 154(b) by 629 days.

(21) Appl. No.: 11/062,018

(22) Filed: Feb. 21, 2005

(65) Prior Publication Data
US 2005/0186486 A1 Aug. 25, 2005

(30) Foreign Application Priority Data
Feb. 20, 2004 (JP) ............................ P2004-044015

(51) Int. Cl.
*G03F 9/00* (2006.01)
(52) U.S. Cl. .............................. 430/5; 430/30; 430/396; 430/311
(58) Field of Classification Search ........................ 430/5
See application file for complete search history.

(56) References Cited

U.S. PATENT DOCUMENTS

| 7,147,975 B2 * | 12/2006 | Misaka ............................ 430/5 |
| 7,166,393 B2 * | 1/2007 | Kamm ............................ 430/5 |
| 2001/0036581 A1 * | 11/2001 | Inao et al. ....................... 430/5 |
| 2001/0051304 A1 * | 12/2001 | Stivers et al. .................... 430/5 |
| 2003/0162104 A1 * | 8/2003 | Shoki ............................. 430/5 |
| 2003/0213613 A1 * | 11/2003 | Strozewski et al. ........... 174/250 |
| 2004/0029023 A1 * | 2/2004 | Misaka ........................... 430/5 |

FOREIGN PATENT DOCUMENTS

EP 05003575.7 1/2008

OTHER PUBLICATIONS

Sugawara, Minoru et al., "Effect of absorber material and mask pattern correction on pattern fidelity in EUV lithography", Proceedings of the SPIE, vol. 5374(1):289-299, Feb. 25, 2004.
Sugawara, Minoru et al., "Effect of incident angle of off-axis illumination on pattern printability in extreme ultraviolet lithography", J. Vac. Sci. Tech. B, 21(6):2701-2705, Nov. 2003.

(Continued)

*Primary Examiner*—Mark F Huff
*Assistant Examiner*—Rashid Alam
(74) *Attorney, Agent, or Firm*—Sonnenschein Nath & Rosenthal LLP

(57) ABSTRACT

A method for correcting an exposure mask including a film of mask blank having reflex function for an EUV and an absorber film patterned on the film of mask blank for absorbing the EUV, the present method includes the steps of obtaining a light energy $E_0$ when the EUV is vertically incident to the front surface of the mask, and when the EUV is incident to the front surface of the mask at an angle that can be considered that it is vertically incident thereto; obtaining a light energy $E_1$ when the EUV is obliquely incident to the front surface of the mask and the EUV is reflected; and correcting the mask pattern in accordance with the compared result of the light energies $E_0$ and $E_1$.

19 Claims, 28 Drawing Sheets

OTHER PUBLICATIONS

Deng, Yunfei et al., "Rigorous EM simulation of the influence of the structure of mask patterns on EUVL imaging", Proceedings of the SPIE, vol. 5037:302-313, Feb. 25, 2003.

Sugawara, Minoru et al., "Simulation study of pattern printability for reflective mask in EUV lithography", Proceedings of the SPIE, vol. 5148:225-234, Jan. 13, 2003.

Pistor, Thomas V. et al., "Modeling Oblique Incidence Effects in Photomasks", Proceedings of the SPIE, vol. 4000:228-237, Mar. 1, 2000.

Otaki, Katsura, "Asymmetric Properties of the Aerial Image in Extreme Ultraviolet Lithography", Jpn. J. Appl. Phys., vol. 39 (12B—part 1):6819-6826, Dec. 1, 2000.

* cited by examiner

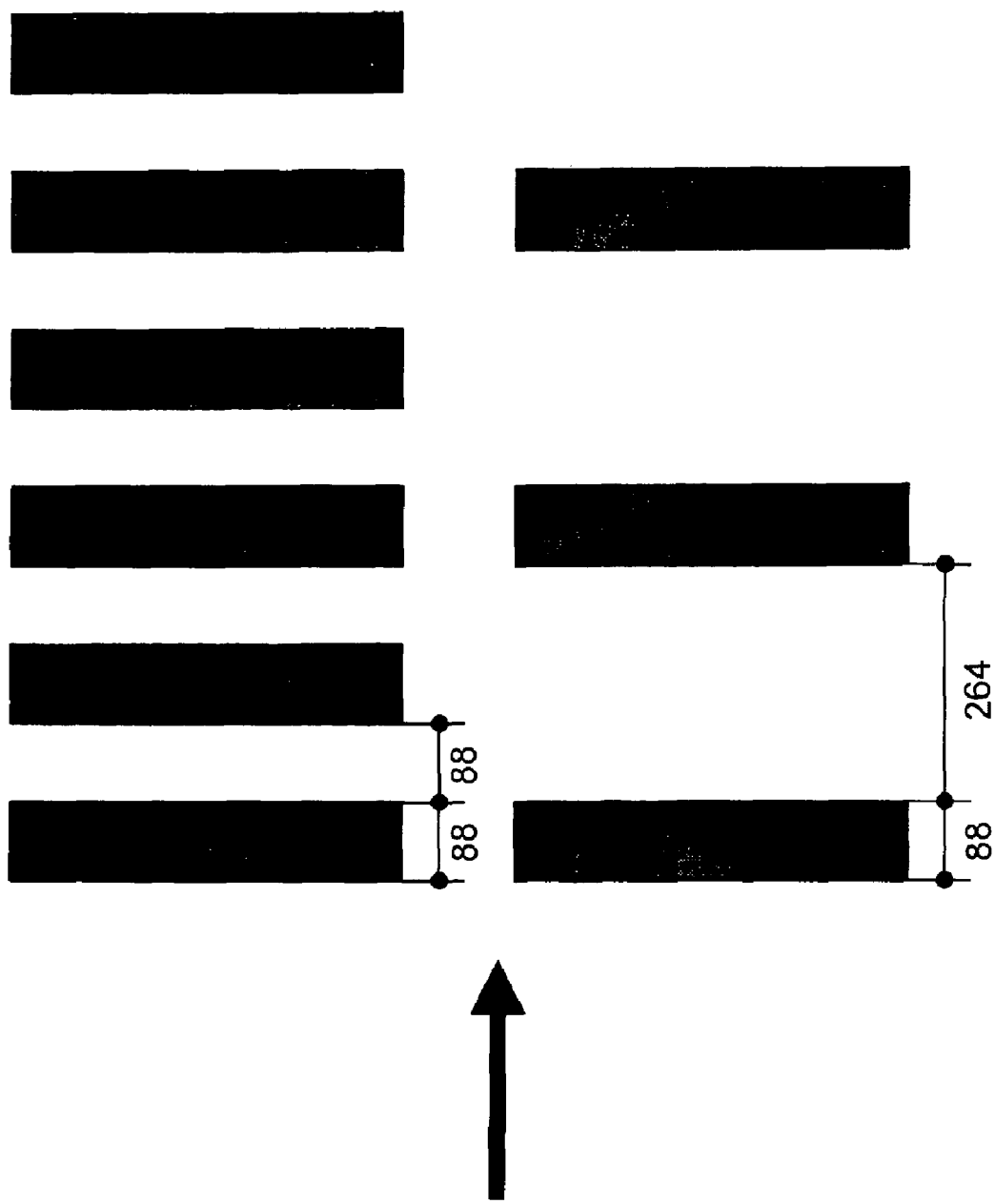

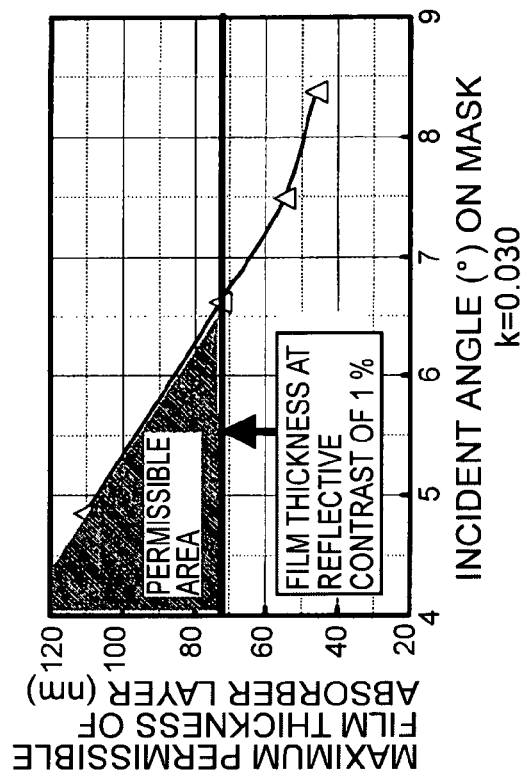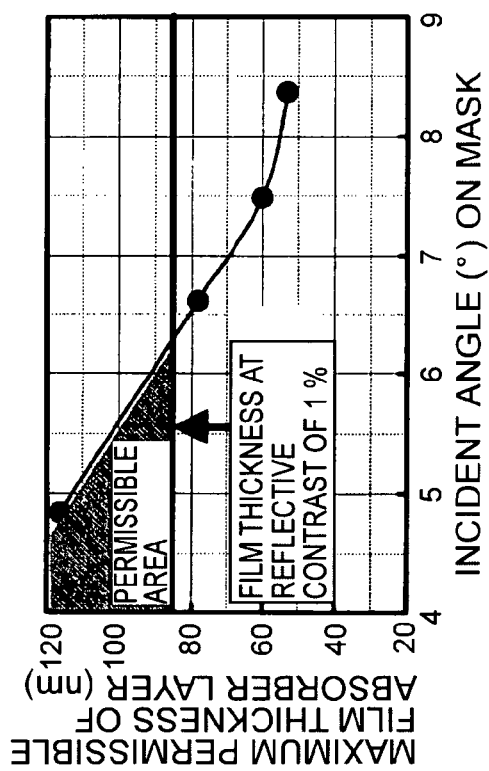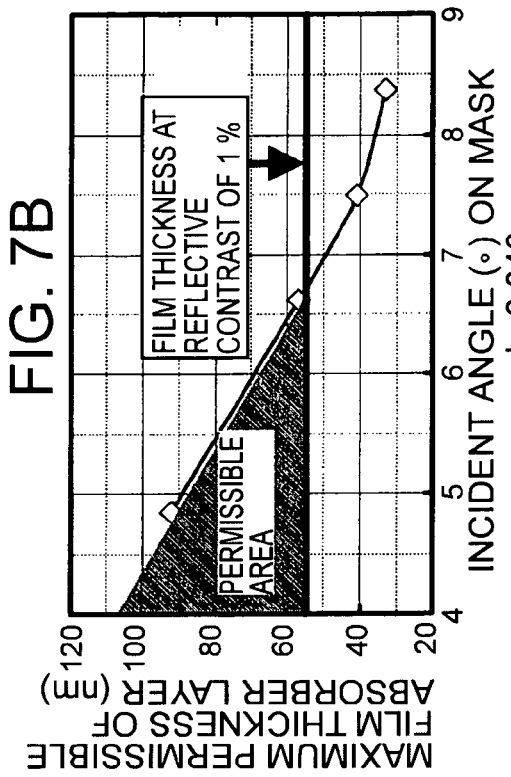
FIG. 7A  k=0.025
FIG. 7B  k=0.030
FIG. 7C  k=0.035
FIG. 7D  k=0.040

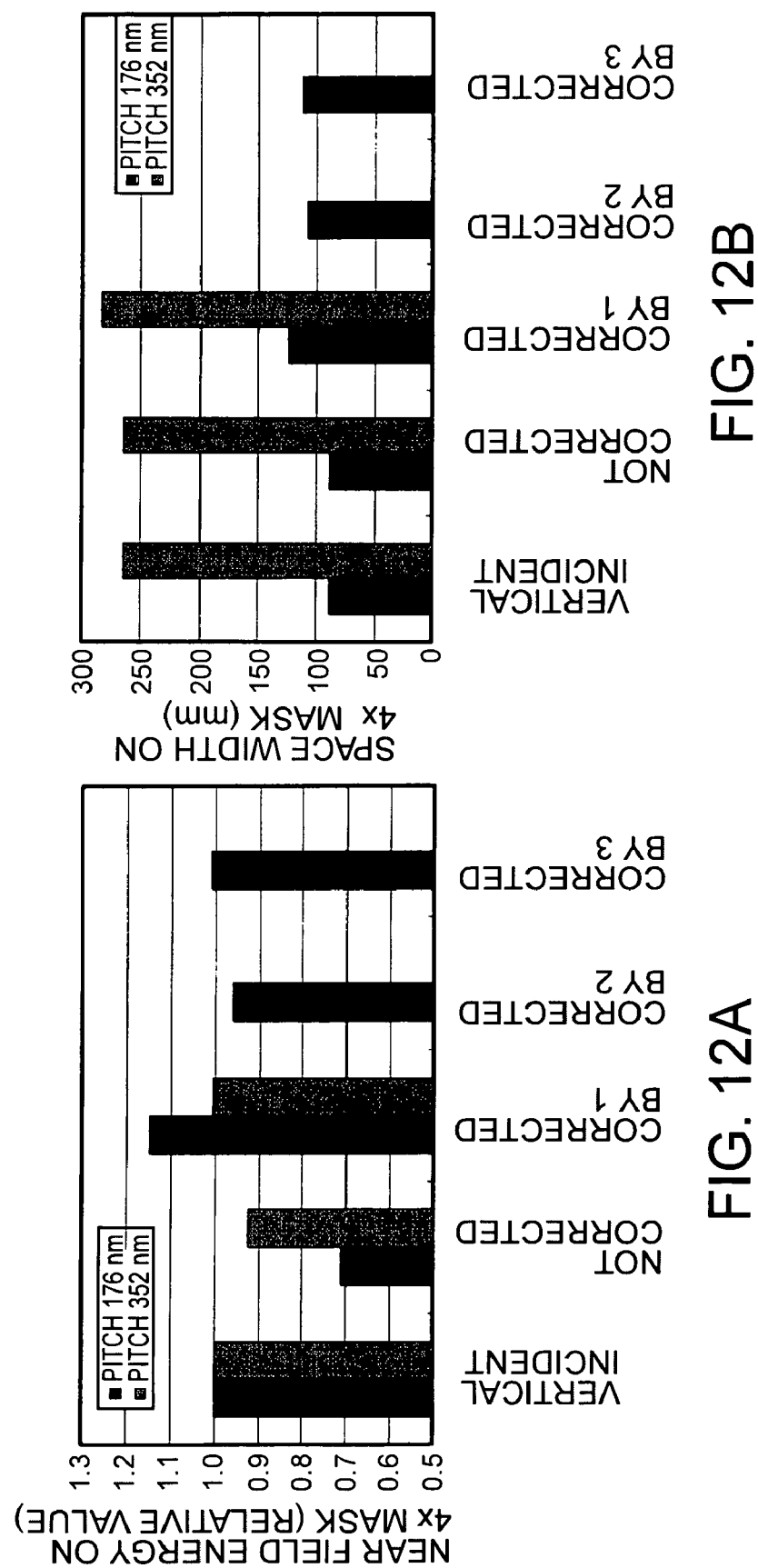

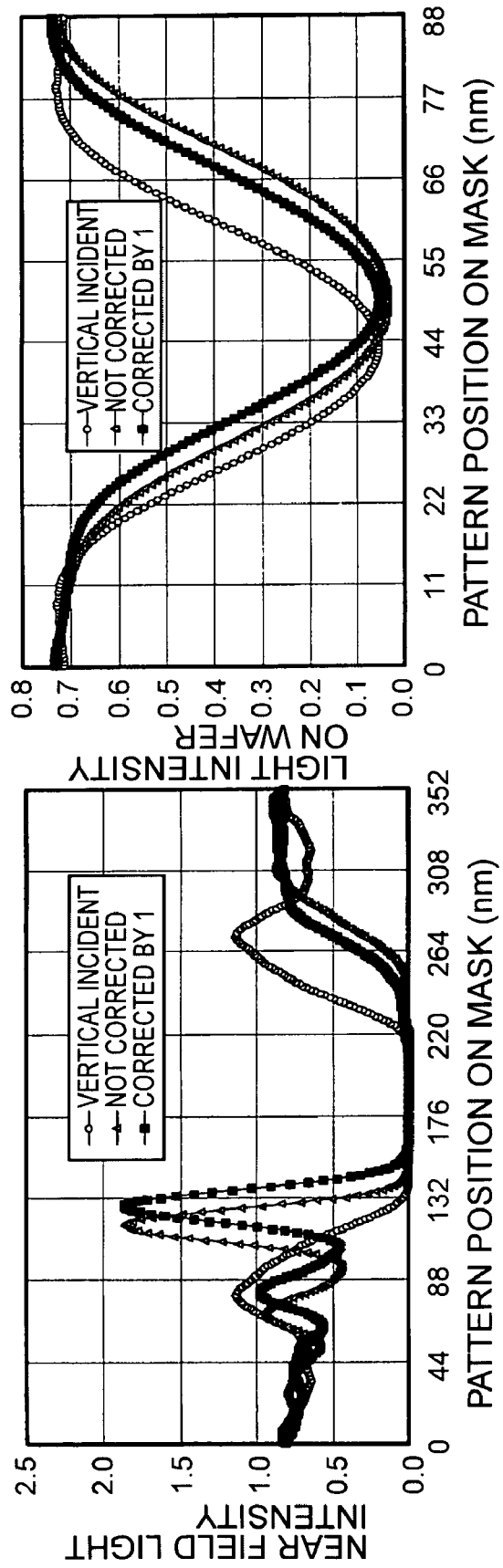

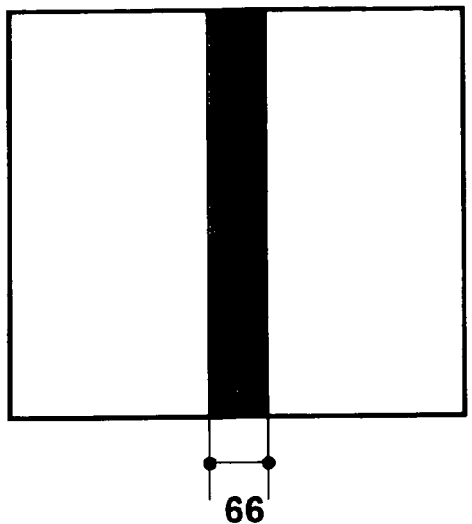
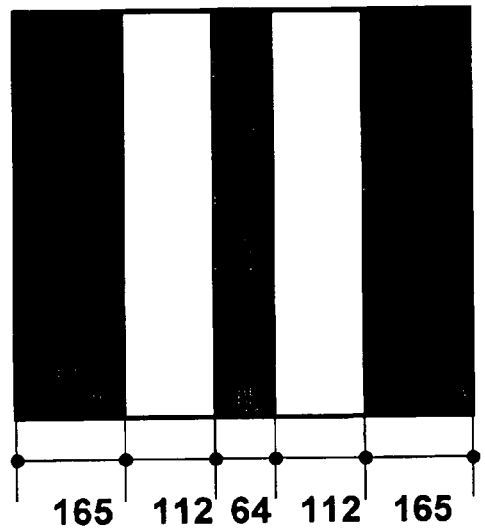
FIG. 18A　　　　　　FIG. 18B
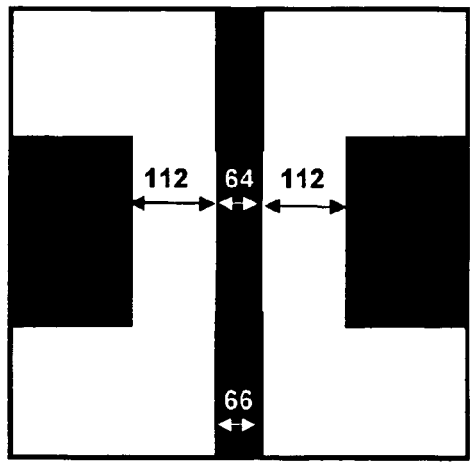
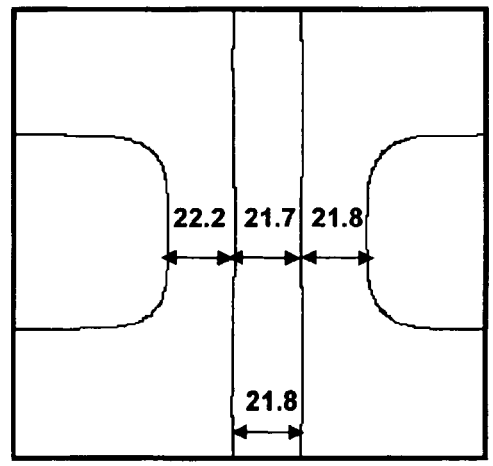
FIG. 19A　　　　　　FIG. 19B

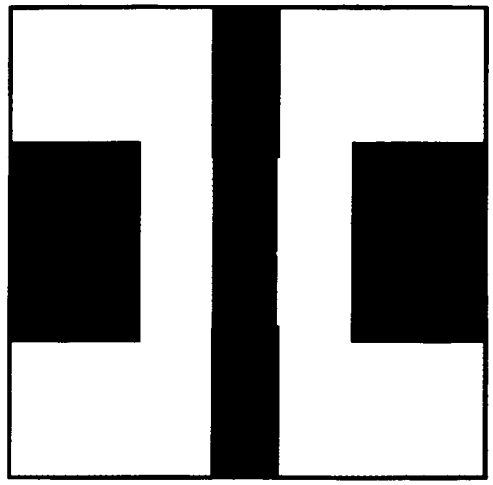
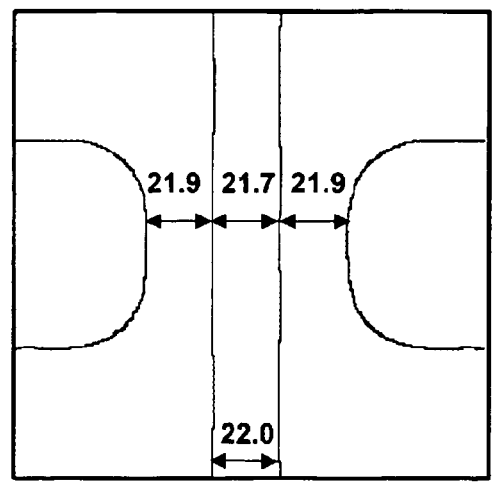
FIG. 24A          FIG. 24B
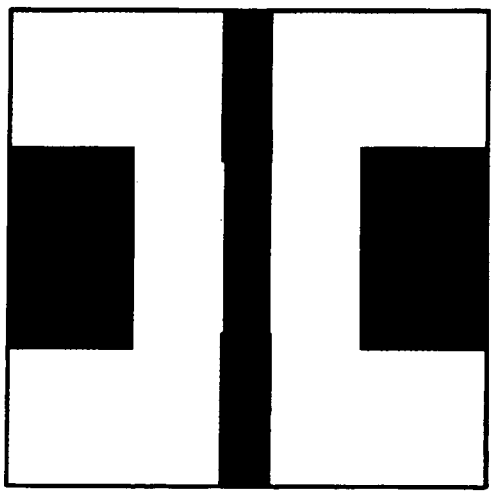
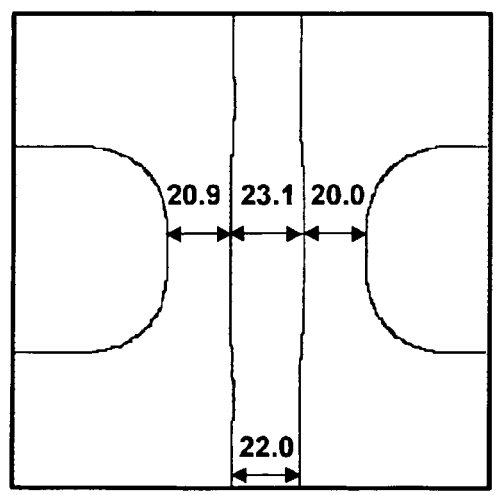
FIG. 25A          FIG. 25B

METHOD FOR CORRECTING MASK PATTERN, EXPOSURE MASK, AND MASK PRODUCING METHOD

CROSS REFERENCE TO RELATED APPLICATION

This application claims priority from Japanese Priority Document No. 2004-044015, filed on Feb. 20, 2004 with the Japanese Patent Office, which document is hereby incorporated by reference.

BACKGROUND OF THE INVENTION

1. Field of the Invention

The present invention relates to a method for correcting an exposure mask used in a lithography step for forming a circuit pattern of a semiconductor device, and particularly to a reflective exposure mask applicable for so-called extreme ultra violet light. In addition, the present invention relates to the exposure mask and a method for producing the exposure mask.

2. Description of Related Art

In recent years, as semiconductor devices have been miniaturized, the line widths of resist patterns formed by exposing and developing resist as photosensitive material coated on wafers and further the line widths of circuit patterns obtained by etching the resist patterns as etching masks have been required to be miniaturized. In addition to the line widths, pattern pitches and so forth have also been required to be miniaturized. These requirements have been satisfied by decreasing wavelengths of light used to expose the resist. It is known that the relation between a wavelength of light and a resolution of a pattern can be expressed by the following Rayleigh's formula.

$$w = k1 \times (\lambda/NA) \quad (1)$$

In the formula (1), a reference code w represents the minimum width of a pattern to be formed; NA represents a numerical aperture of the lens of a projection optical system; and $\lambda$ represents a wavelength of an exposure light. In addition, it is known that a reference code k1 represents a process constant decided by the performance of the resist and the selection of resolution enhancement technology, and depending on the most suitable resist and resolution enhancement technology, the process constant K1 of around k1=0.35 can be achieved. The resolution enhancement technology is a technology in which a ± first order diffraction light of the light transmitted or reflected by a mask and diffracted by a light insulating pattern disposed on the mask is selectively used to obtain a smaller pattern than the wavelength of the light.

The Rayleigh's formula represents that when a lens of NA=0.9 is used, the minimum pattern width applicable for a wavelength of, for example, 157 nm is w=61 nm. In other words, in order to obtain a pattern width smaller than 61 nm, exposure light having a wavelength of shorter than 157 nm or a liquid immersion lens should be used. When the light having a wavelength of 157 nm and a liquid immersion lens having numerical aperture NA=1.2 are used, the minimum pattern width becomes as small as 46 nm. Thus, after the 45 nm generation, it is discussed to use an exposure light having a wavelength band of around 0.6 nm and a center wavelength of 13.5 nm, and this light is called an extreme ultra violet (EUV) (refer to patent Document 1 listed below). When the EUV and an exposing unit having numerical aperture NA=0.25 are used, a line width of w≧32.4 nm could be formed under the condition of k1≧0.6 according to the Rayleigh's formula.

However, when the EUV having a wavelength of 13.5 nm is used, it is necessary to form an exposure mask and an optical system rather than a transparent mask and an optical system by a reflective mask and a reflective optical system, respectively. In other words, since there exist transparent materials such as Calcium Fluoride ($CaF_2$) and silicon dioxide ($SiO_2$), which can transmit up to an ultraviolet light having a wavelength of 157 nm, a mask and the optical system that can transmit the ultra violet light can be produced. However, there exist no materials that have a desired thickness and transmit the EUV having a wavelength of 13.5 nm.

In addition, when a reflective mask is used, the light reflected on the front surface of the mask should be guided to the projection optical system without mutual interference with the light incident to the mask. Thus, the light that is incident to the reflective mask inevitably has an angle of $\phi$ against the normal of the front surface of the mask. In other words, when the resist is exposed with the EUV, the light that is incident to the front surface of the exposure mask has an angle against the normal of the front surface of the mask (for example, refer to the patent Document 2 listed below). This angle depends on the numerical aperture NA of the lens of the projection optical system, the magnification m of the mask, and the intensity $\sigma$ of the light source. Specifically, when a mask having a magnification of 4× is disposed on a wafer, and when an exposing unit having NA=0.3 is used, the light is incident to the mask with an incident angle greater than 4.30° against the normal of the surface of the mask. Likewise, in an exposing unit having NA=0.25, the light is incident to the mask at an incident angle greater than 3.58°.

In the lithography step of the production process of semiconductor devices, after the light is exposed to wafers, desired transfer images (patterns) should be obtained on the wafers. However, due to the influence of the optical proximity effect, even if an exposure mask is produced in accordance with its designed values, a desired transfer image cannot be always obtained. In particular, when pattern widths, pattern pitches, and so forth are decreased, as patterns are miniaturized, the difference between the mask pattern and the shape of the transferred image tends to become larger. Thus, in consideration of the optical proximity effect, an optical proximity effect correction (OPC) of which a mask pattern on an exposure mask used in the lithography step is corrected in the design stage is performed (refer to for example the patent Document 3 listed below).

The OPC for a mask pattern on an exposure mask is performed in the following manner. When a transparent mask is used, the light is vertically incident to the front surface of the mask. Thus, the center position of a pattern of an image transferred on a wafer matches the center position of a mask pattern on a mask. When a transferred image that is different from a desired pattern is obtained on a wafer, the mask pattern is corrected so that the relation of C=ΔL/Mm is satisfied on the mask. In this formula, a reference code C represents the correction amount of the shape of the pattern on the mask; ΔL represents the difference between the size of the image transferred on the wafer and the size of the desired pattern. In addition, a reference code Mm represents an error factor of the mask that is defined as Mm=(ΔW/ΔM), where ΔMm represents the ratio of ΔM by which the size of the mask pattern is changed to ΔW by which the size of the pattern of the transferred image is changed on the wafer.

Patent Document 1: Japanese Patent Application Unexamined Publication No. 2002-365785

Patent Document 2: Japanese Patent Application Unexamined Publication No. 2003-257810

Patent Document 3: Japanese Patent Application Unexamined Publication No. 2002-122977

SUMMARY OF THE INVENTION

However, when the EUV is used, the light is obliquely incident to the front surface of the exposure mask with an angle to the normal of the front surface. Thus, the difference cannot be always properly corrected by the foregoing correcting method of the related art. This is because when the EUV is obliquely incident to the front surface of the mask, the EUV is affected by not only the optical proximity effect, but also the oblique incident effect.

Obliquely incident exposure light has two functions. The first function causes the position of the pattern to be shifted in the direction of the incident light. The second function causes an image formed on a wafer to deform and the fidelity of the image to deteriorate. Among them, in the first function, where the position of the pattern is shifted in the direction of the incident light, the shift amount of the pattern on the wafer can be estimated with the transferred result on the wafer using a line pattern or a line and space pattern. Thus, by offsetting the entire mask pattern or by setting an offset value to the exposing unit, the pattern shift can be corrected.

However, in the second function, where the fidelity of a transferred image on a wafer deteriorates, the deformed amount varies with the angle between a structural side of the mask pattern and an incident vector of obliquely incident light. In the case of a line pattern that extends in the direction perpendicular to a vector of the incident light, the deformed amount of a pattern edge on the near side of the incident light is different from the deformed amount of a pattern edge on the far side of the incident light. As a result, the position of the center of gravity of the line pattern deviates.

Specifically, in patterns shown in FIG. 36A and FIG. 36B, even if there are 2 pattern orientations against a vector of the incident light, the corrected amounts of pattern edges A, B, C, and D on transferred images on wafers differ in layouts shown in FIG. 36A and FIG. 36B. Thus, when a reflective mask for EUV with obliquely incident light is used, the mask may not be properly corrected by the technology of the related art because the influence of the oblique incident effect is not considered.

The phenomenon of which the fidelity of a transferred image on a wafer deteriorates due to the exposure light that is obliquely incident to the mask and the phenomenon of which the fidelity of a transferred image on a wafer deteriorates due to the optical proximity effect occur by different causes. Thus, they are preferred to be independently corrected. In other words, the proximity effect is preferably corrected with a constant mask error factor Mm rather than the orientation of the obliquely incident light on a mask on a side of a pattern to the vector of the incident light, and then corrected with the obliquely incident light regardless of the mask error factor Mm.

Therefore, the present invention is to provide a method for correcting a mask pattern, an exposure mask, and a method for producing the mask, capable of allowing a mask pattern for an exposure mask in a lithography step using an EUV to be corrected in consideration of the influence of the oblique incident effect so as to prevent the fidelity of a transferred image on a wafer from deteriorating and improve the performance of a semiconductor device produced through the lithography step.

To accomplish the foregoing, a first aspect of the present invention is a method for correcting a mask pattern. In other words, the first aspect of the present invention is a method for correcting an exposure mask including a film of mask blank having reflex function for an EUV and an absorber film patterned on the film of mask blank for absorbing the EUV, and the exposure mask transfers an image corresponding to a mask pattern formed on the absorber film with the reflected EUV obliquely incident to the front surface of the mask. The method includes the steps of obtaining a light energy $E_0$ when the EUV is vertically incident to the front surface of the mask, or when the EUV is incident to the front surface of the mask at an angle that can be considered that it is vertically incident thereto; obtaining a light energy $E_1$ when the EUV is obliquely incident to the front surface of the mask and the EUV is reflected; and correcting the mask pattern in accordance with the compared result of the light energies $E_0$ and $E_1$.

To accomplish the foregoing, a second aspect of the present invention is an exposure mask. In other words, the second aspect of the present invention is an exposure mask including a film of mask blank having reflex function for an EUV and an absorber film patterned on the film of mask blank for absorbing the EUV, and the exposure mask transfers an image corresponding to the mask pattern formed on the absorber film with reflected EUV obliquely incident to the front surface of the mask. The exposure mask is produced by the method includes the steps of obtaining a light energy $E_0$ when the EUV is vertically incident to the front surface of the mask, or when the EUV is incident to the front surface of the mask at an angle that can be considered that it is vertically incident thereto; obtaining a light energy $E_1$ when the EUV is obliquely incident to the front surface of the mask and the EUV is reflected; and correcting the mask pattern in accordance with the compared result of the light energies $E_0$ and $E_1$.

To accomplish the foregoing, a third aspect of the present invention is a method for producing a mask. In other words, the third aspect of the present invention is a method for producing an exposure mask including a film of mask blank having reflex function for an EUV and an absorber film patterned on the film of mask blank for absorbing the EUV, and the mask transfers an image corresponding to the mask pattern formed on the absorber film with the reflected EUV obliquely incident to the front surface of the mask. The mask is produced by the method includes the steps of obtaining a light energy $E_0$ when the EUV is vertically incident to the front surface of the mask, or when the EUV is incident to the front surface of the mask at an angle that can be considered that it is vertically incident thereto; obtaining a light energy $E_1$ when the EUV is obliquely incident to the front surface of the mask and the EUV is reflected; and correcting the mask pattern in accordance with the compared result of the light energies $E_0$ and $E_1$.

According to the method for correcting the mask pattern comprising the foregoing steps, the exposure mask produced by the method, and the method for producing the mask that is produced by the method for producing the exposure mask, before the mask pattern is corrected, the light energies $E_0$ and $E_1$ of which the mask pattern is formed on the front surface of the mask are obtained. The light energies $E_0$ and $E_1$ are preferred to be obtained with a near field light. The "near field light" is the light that reaches only a near field area, an area having a wavelength shorter than the wavelength of the light, when the light is reflected on the front surface of the mask. Alternatively, the light energies may be obtained with a distance smaller than twice the wavelength λ (the wavelength of exposure light) of the EUV from the front surface of the absorber layer rather than the near field light. At a position apart from the front surface of the absorber layer by 2λ or less, the light energies can be obtained. At a distance apart from the front surface of the absorber layer by 2λ or less, the distribution of the diffracted lights can be considered to be equal. Thus, at a position apart from the front surface of the absorption layer by 2λ or less, the light energies can be obtained. These light energies can be obtained by definitely integrating the distribution of light intensities of the near field light. The "EUV is vertically incident" to the front surface of the mask means that the EUV is incident along a normal vector to the front surface of the mask, namely at an incident angle of 0°.

On the other hand, "the EUV is incident to the front surface of the mask at an angle that can be considered that it is vertically incident thereto" means that although the EUV is obliquely incident to the front surface of the mask at an incident angle smaller than a predetermined value, since the obtained light energies are almost the same as those of which the EUV is vertically incident to the front surface of the mask, the EUV can be considered to be vertically incident to the front surface of the mask. Based on the energy $E_0$, with the compared result of the energy $E_0$ and the energy $E_1$, the mask pattern is corrected so that the energy $E_1$ almost becomes the same as the energy $E_0$. When the mask pattern is corrected, even if the EUV is obliquely incident to the front surface of the mask, the light energy of which the EUV is reflected almost becomes the same as the light energy of which the EUV is vertically incident. In other words, with the mask pattern that is corrected, as if light were vertically incident to the front surface of the mask, an image can be exposed and transferred to the wafer.

According to the method for correcting the mask pattern, the exposure mask, and the method for producing the mask of the present invention, even if the EUV is obliquely incident to the front surface of the mask, when the mask pattern is corrected, an image can be exposed and transferred to a wafer as if the EUV is vertically incident to the front surface of the mask. Thus, the fidelity of an image transferred to the wafer can be prevented from deteriorating against the influence of the oblique incident effect. As a result, an image can be transferred as it is designed. In other words, when the mask pattern is corrected according to the present invention, the performance of semiconductor devices produced through the lithography step using EUV can be improved.

BRIEF DESCRIPTION OF THE DRAWINGS

FIG. 4 is a schematic diagram showing an example of a mask pattern describing the relation of a permissible film thickness of an absorber film and a permissible incident angle of an exposure light;

FIG. 7A, FIG. 7B, FIG. 7C, and FIG. 7D are graphs describing specific examples of conditions for satisfying both a permissible linewidth and a contrast, in particular, a permissible area for satisfying both conditions of the maximum permissible film thickness for linewidth ±5% and a reflectance contrast of 1% or smaller;

FIG. 12A and FIG. 12B are graphs describing specific examples of relative amounts of the near field energy and space width on the mask shown in FIG. 11 to which the exposure light is vertically incident and the near field energy on the mask to which the exposure light is obliquely incident corresponding to the number of times the mask is corrected;

FIG. 14A and FIG. 14B are graphs describing a specific example of a process for correcting the intensity of the near field light on the exposure mask shown in FIG. 11 corresponding to the number of times the mask pattern as a sparse pattern shown in FIG. 4 is corrected and a specific example of a process for correcting the distribution of the light intensities on the wafer corresponding to the number of times the mask pattern is corrected;

FIG. 18A and FIG. 18B are schematic diagrams describing the results of which the model patterns are corrected against an incident angle of 7.6°;

FIG. 19A and FIG. 19B are schematic diagrams showing specific examples of a mask pattern corrected with the corrected results shown in FIG. 18A and FIG. 18B and a transferred image as a result of which the mask pattern is exposed;

FIG. 24A and FIG. 24B are schematic diagrams describing examples of a mask pattern and a transferred image on the wafer in the case that the OPC is performed for the pattern on the mask to which the exposure light is incident at an incident angle of 0° shown in FIG. 16 and the mask pattern is exposed under the conditions of NA=0.25 and σ=0.70 (process factor k1=0.4);

FIG. 25A and FIG. 25B are schematic diagrams describing specific examples of a corrected mask pattern and a transferred result on the wafer when the OPC is performed for the pattern shown in FIG. 16 under the conditions of an incident angle=0°, NA=0.25, and σ=0.70 (process factor k1=0.4) and the near field energy on the mask to which the exposure light is incident at an incident angle of 7.6° is nearly matched with the near field energy on the mask to which the exposure light is incident at an incident angle of 0° (vertical incident);

DESCRIPTION OF THE PREFERRED EMBODIMENTS

Figure 1:
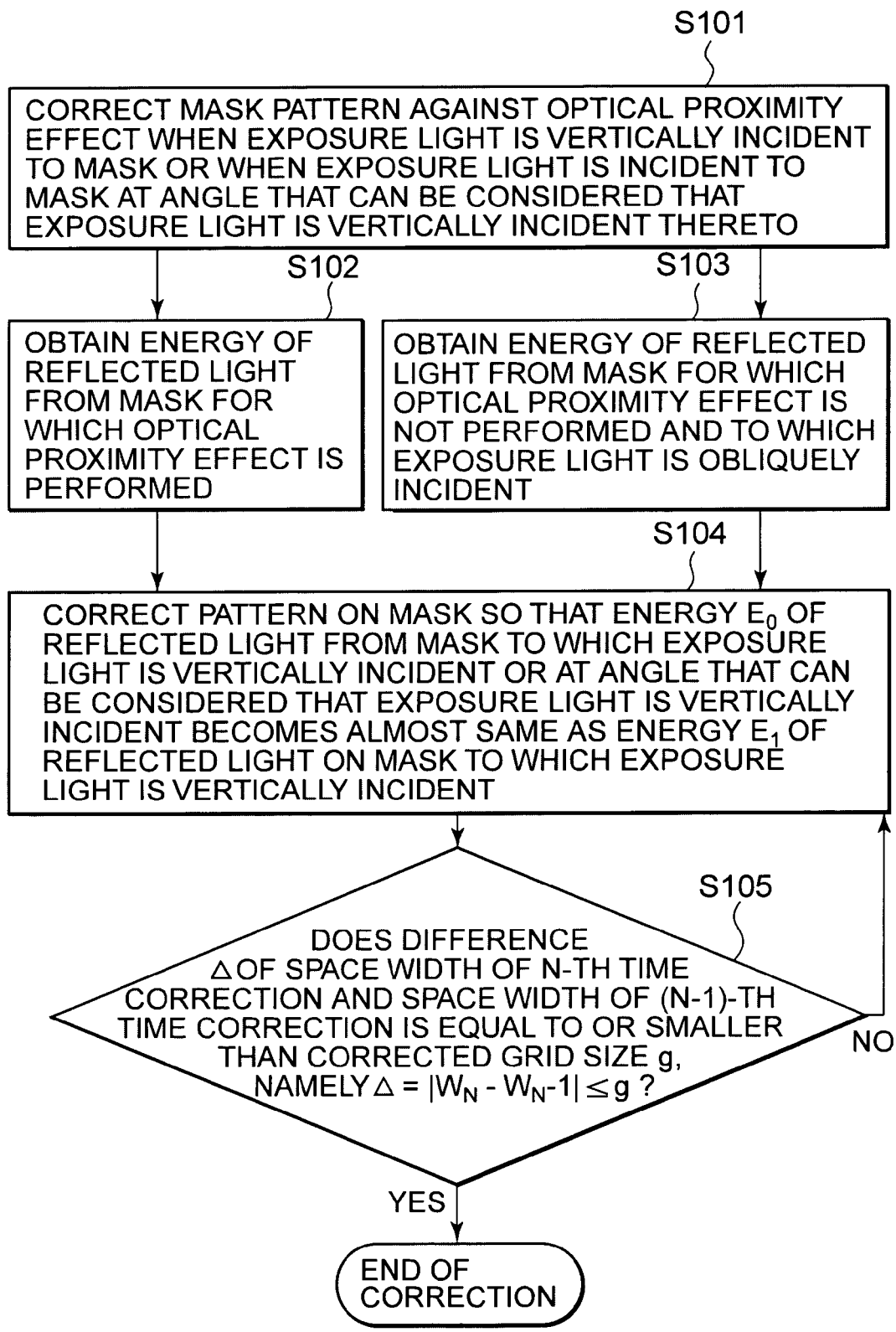
FIG. 1 is a flow chart showing an example of a process of a method for correcting a mask pattern according to the present invention.

Next, with reference to the accompanying drawings, a method for correcting a mask pattern, an exposure mask, and a method for producing a mask will be described. Of course, it should be noted that the present invention is not limited to the following embodiments.

First of all, the structure of an exposure mask will be briefly described. The exposure mask is used to reflect an EUV and transfer a desired pattern (for example, a circuit pattern) on a wafer at a lithography step in a producing method for semiconductor devices. As typified with a wavelength of 13.5 nm, the "EUV" is light having shorter wavelengths (for example, 1 nm to 100 nm) than ultraviolet light used in the conventional lithography step.

The exposure mask is composed of a film of mask blank and an absorber film so as to reflect the EUV and expose and transfer an image of a desired pattern on a wafer. The film of mask blank reflects the EUV. The absorber film is patterned on the film of mask blank. The absorber film absorbs the EUV. The film of mask blank is normally composed of 40 or more layers of for example silicon (Si) layers and molybdenum (Mo) layers that are alternately stacked.

The absorber layer is made of a material that absorbs the EUV. The absorber layer is for example a tantalum nitride (TaN) layer. However, the absorber film may be made of another material as long it can be used as a mask for the EUV. Specifically, besides TaN, the absorber layer may be made of tantalum (Ta) or a compound of Ta, chromium (Cr), or a compound of Cr, tungsten (W), or a compound of W. Formed between the film of mask blank and the absorber film may be a buffer film made of for example a ruthenium (Ru) layer, a silicon dioxide ($SiO_2$) layer, or a chromium (Cr) layer as an etching stopper used to form the absorber film or to prevent the absorber film that has been formed from being damaged when defects are removed therefrom.

When this exposure mask is produced, if necessary, after a buffer layer is formed on the film of mask blank, the absorber film is formed. By the known lithograph technology, the absorber film is formed with a desired pattern. As a result, the reflective exposure mask for the EUV can be obtained.

However, even if a mask pattern is formed on the exposure mask in accordance with designed values, namely the mask pattern of the exposure mask is the same as or analogous to a desired pattern to be exposed and transferred, because of the optical proximity effect, oblique incident effect, and so forth, the desired transferred image cannot be always obtained. Thus, there is a possibility of which the fidelity of the transferred image on the wafer deteriorates. Thus, when an exposure mask is produced, before a mask pattern is formed on the absorber film, it is necessary to correct the mask pattern in the design stage.

There would be 3 factors of which the transferred image on the wafer does not match the designed image: (a) the transferred image deforms due to the optical proximity effect, (b) the pattern position shifts because exposure light is obliquely incident to the wafer, and (c) the transferred image deforms due to the oblique incident effect.

Among them, the deformation of the transferred image as the factor (a) would be solved in the following manner. The optical proximity effect takes place when the process constant k1 of the foregoing formula (1) becomes smaller than 0.6. In other words, since higher order diffracted light from the mask pattern is apart from the pupil plane of the projection lens system and part of the primary diffracted light is apart from the pupil plane, the shape of the transferred image on the wafer is different from the shape of the desired pattern. Thus, the deformation of the transferred image on the wafer due to the optical proximity effect can be corrected by pre-deforming the mask pattern like, for example, OPC.

The deformation of the transferred image on the wafer due to the factor (b) would be able to be solved as follows. As described above, the exposure light that is obliquely incident to the mask has two functions. The first function causes the pattern position to be shifted to the light incident direction. In other words, the exposure light that is obliquely incident to the mask causes diffracted light beams to be asymmetrical. As a result, the pattern position of the transferred image on the wafer is shifted to the light incident direction. However, the position shift amount can be almost considered as a constant, not dependent on the shape of the mask pattern. Thus, to solve the problem of which the position of the pattern is shifted due to the obliquely incident light, the mask pattern needs to be equally moved or the pattern needs to be shifted in the exposing unit when the pattern is transferred to the wafer. In other words, when the entire mask pattern is offset or the exposing conditions of the exposing unit are properly set, the shift amount of the pattern can be corrected.

On the other hand, the problem of the other function due to the exposure light that is obliquely incident, namely the deformation of the transferred image on the wafer due to the factor (c), can be solved as follows. The transferred image on the wafer is deformed due to the oblique incident effect. In other words, the exposure light that is obliquely incident to the mask causes diffracted light beams from the mask pattern to be asymmetrical. In addition, the mask pattern blocks part of the reflected light. As a result, the pattern contrast of the transferred image on the wafer lowers. Thus, the fidelity of the shape of the transferred image on the wafer becomes lower in a layout of which the blocked light amount is smaller than the reflected light amount, namely a dense layout and an isolated space. Like the deformation due to the optical proximity effect, the deformation of the transferred image on the wafer can be removed by correcting the deformation of the mask pattern.

In the following method for correcting a mask pattern, the deformation of the transferred image on the wafer due to the oblique incident effect as the factor (c) is corrected. Thus, even if the reflective mask for the EUV is used, the transferred image on the wafer can have desired fidelity. The corrections for the transferred image on the wafer due to the factors (a) and (b) are performed independent from the correction for the mask pattern that will be described later. In addition, since they can be performed with the known technology, their description will be omitted in this specification.

Next, the correction of the mask pattern against the transferred image on the wafer due to the oblique incident effect as the factor (c) will be described. FIG. 1 is a flow chart showing a process for correcting the deformation of a transferred image on a wafer due to the oblique incident effect, namely a process of a method for correcting a mask pattern according to the present invention.

As shown in FIG. 1, before a mask pattern is formed, it is corrected according to the embodiment of the present invention. At the first step, the OPC is performed for a mask pattern to be formed as a reference (a mask pattern corresponding to designed values) (at step S101, hereinafter the step is abbreviated as "S"). However, in this case, the OPC is performed assuming that exposure light is vertically incident to the front surface of the mask or at an angle that can be considered that it is vertically incident thereto. In this case, "exposure light is vertically incident to the front surface of the mask" means that exposure light is incident to the front surface of the mask along a normal vector to the front surface of the mask. In other words, so-called incident angle is 0°. On the other hand, the "exposure light is incident to the front surface of the mask at an angle that can be considered that it is vertically incident thereto" means that although the exposure light is obliquely incident to the front surface of the mask at an incident angle smaller than a predetermined value, since the incident angle is small, the obtained optical energy is almost same as the optical energy of which the exposure light is vertically incident as will be described later. Thus, the exposure light can be considered to be exposure light that is vertically incident.

Specifically, when a 4× mask (where 4× represents a magnification of 4 times) and an exposing unit having NA=0.3 are used, if the exposure light is incident to the normal of the front surface of the mask at an incident angle of 4.30° or smaller, the exposure light can be considered to be exposure light that is vertically incident to the front surface of the mask. Likewise, when an exposing unit having NA=0.25 is used, if the incident angle of the exposure light is 3.58° or smaller, such exposure light can be considered to be the exposure light that is vertically incident to the front surface of the mask.

At the first step, it can be thought that the OPC is performed using a simulation technology. However, since the OPC is performed for the exposure light that is vertically incident or that can be considered as the exposure light that is vertically incident, any known technology can be used. Thus, the specification does not mention the detail of the known simulation technology. In addition, the OPC does not always need to be performed using a simulation technology. Alternatively, the shape of a transferred image on the wafer as an exposed result of the mask pattern may be measured. The OPC may be performed in accordance with the measured result.

The OPC is performed so as to keep the fidelity of the shape of a transferred image on the wafer when the exposure light is vertically incident to the reference mask pattern or at an angle that can be considered that it is vertically incident thereto. When the fidelity of the shape of the transferred image on the wafer against the reference mask pattern is kept, the correction accuracy of the mask pattern can be improved as will be described later. Thus, when the fidelity of the shape of the transferred image on the wafer is kept, the first step does not always need to be performed.

Thereafter, at the second step, after the OPC has been performed, when the exposure light is vertically incident to the reference mask pattern or at an angle that can be considered that it is vertically incident thereto, an energy $E_0$ of reflected light of the exposure light is obtained (at step S102). Specifically, the energy E0 of the near field light of the reflected exposure light is obtained. In this case, the "near field light" means light that reaches only the near field region (a shorter region than the wavelength of the light). However, the energy $E_0$ does not always need to be obtained as the near field light.

Figure 2:
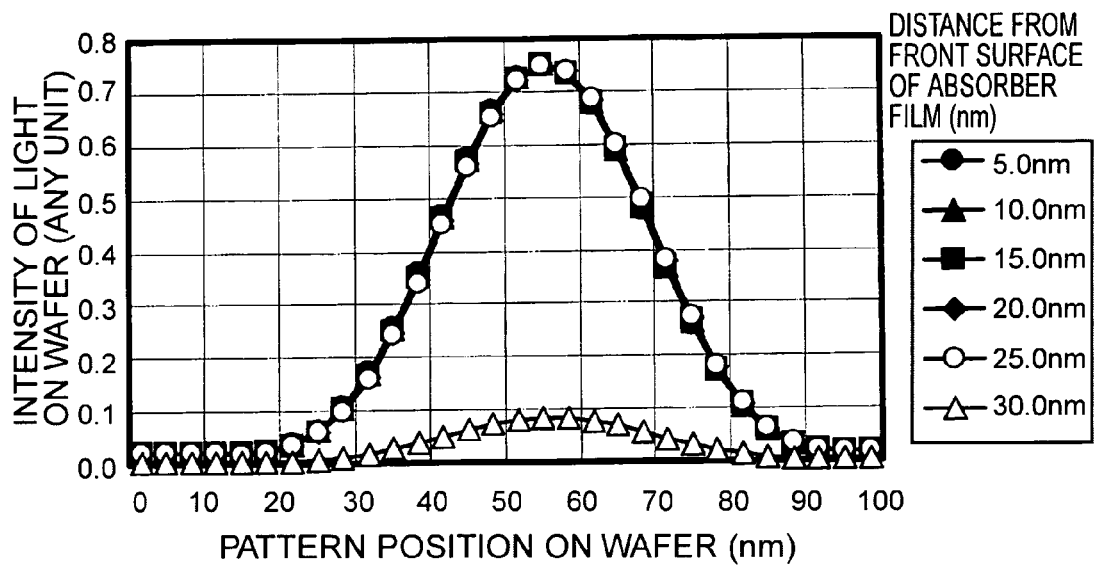
FIG. 2 is a graph showing a specific example of the relation between a light intensity on a wafer and a distance from the front surface of an absorber film.

Alternatively, the energy of light at a distance apart from the front surface of the absorber layer by twice or smaller than the wavelength $\lambda$ of the EUV (wavelength of exposure light). As shown in FIG. 2, a simulation result shows that when the distance is around twice the wave length, the light intensity on the wafer of diffracted light obtained in the near field region matches the light intensity on the wafer of diffracted light at a distance of $\lambda < r \leqq 2\lambda$ from the front surface of the absorber layer.

In other words, when the distance is equal to or smaller than $2\lambda$ from the front surface of the absorber layer, the distribution of diffused light can be considered to be equal. Thus, the energy of light can be obtained at a distance of $2\lambda$ or smaller from the front surface of the absorber layer. Next, the case of which the energy $E_0$ of the near field light will be described.

The energy of the near field light can be obtained in the following process. The EUV used as the exposure light has a broad spectrum. After the EUV is repeatedly reflected by multi-layer mirrors of the lighting optical system and projection optical system, the resultant light as the exposure light having wavelengths in the range from 13.15 nm to 13.75 nm reaches the wafer. Thus, the distribution of the light intensities in the near field region on the mask is obtained by integrating the distribution of the light intensities with wavelengths weighted by an energy distribution function of the exposure light that reaches the wafer in the wavelength band. In other words, the distribution J of the light intensity in the near field region on the mask is given by the following formula (2).

$$J(x) = C^{-1} \int R(\lambda) J(\lambda, x) d\lambda \quad (2)$$

In the formula (2), the $R(\lambda)$ represents an energy distribution function of exposure light that reaches the wafer; $J(\lambda, x)$ represents a light intensity distribution of each wavelength; and C represents a normalized constant. The $R(\lambda)$ is given as a product of the reflectance $R_E(\lambda)$ of the reflection mirrors of the lighting optical system and the projection optical system and the reflectance $R_M(\lambda)$ of the film of mask blank as the following formula (3).

$$R(\lambda) = R_E(\lambda)^{12} R_M(\lambda) \quad (3)$$

As represented by the following formula (4), when the J(x) is integrated for the region of x, the energy $E_0$ of the near field light on the front surface of the mask can be obtained.

$$E = \int_{x1}^{x2} J(x) dx \quad (4)$$

Thus, at the second step, assuming that the exposure light is vertically incident to the front surface of the mask or at an angle that can be considered that the incident light is vertically incident hereto, the energy $E_0$ of the near field light on the front surface of the mask is obtained by definitely integrating the distribution of light intensities of the near field light.

At the third step, when the exposure light is incident to the front surface of the mask at the same incident angle as the reference mask pattern (for which the OPC has not been performed at the first step) in the same manner as that at the second step, an energy $E_1$ of the near field light of reflected light from the front surface of the mask is obtained (at step S103). It should be noted that the third step needs not to be preceded by the first step and the second step. Instead, the third step may be followed by the first step and the second step.

After the first to third steps have been completed, a fourth step is performed. At the fourth step, the energy $E_0$ obtained at the second step is compared with the energy $E_1$ obtained at the third step. In accordance with the compared result, the mask pattern is corrected against the reference mask pattern (at step S104). The mask pattern is corrected so that the energy $E_1$ becomes almost the same as the energy $E_0$.

For example, the case of which the pattern size of the master pattern is corrected is considered. In this case, assuming that in the case that the exposure light is vertically incident to the mask, the space width of the reference mask pattern is $w_0$; and in the case that exposure light is obliquely incident to the mask pattern, the space width is $w_1$ (where $w_0 = w_1$), when the mask pattern is corrected so that the energy $E_1$ becomes almost the same as the energy $E_0$, the space width $w_2$ on the mask that is corrected is given by the following formula (5).

$$w_2 = w_1 \times (E_0/E_1) \quad (5)$$

In the same manner, the positions of pattern edges of the mask pattern can be corrected. In other words, at the fourth step, at least one of the pattern size and pattern positions is corrected against the reference mask pattern so that for example the energy $E_1$ becomes almost the same as the energy $E_0$.

After the fourth step, the following steps are performed so as to further improve the correction accuracy of the mask pattern. When the pattern size of the mask pattern is corrected at the fourth step, with the space width $w_2$ on the mask that has been corrected, the energy $E_2$ of the near field light on the mask of the obliquely incident light at the same incident angle as the mask pattern is obtained. At this point, in the same manner as that at the fourth step, the energy $E_2$ is obtained. After the energy $E_2$ has been obtained, it is compared with the energy $E_0$ that has been obtained. In accordance with the compared result, the mask pattern is corrected. The mask pattern is corrected so that the energy $E_2$ becomes almost equal to the energy $E_0$. At this point, the space width $w_3$ on the mask that has been corrected is given by the following formula (6).

$$w_3 = w_2 \times (E_0/E_2) \quad (6)$$

When this step is repeated (n-1) times, the near field energy $E_{n-1}$ on the mask of the exposure light that is obliquely incident thereto at the same angle as the exposure light for the mask pattern that is exposed and transferred on the basis of the space width $w_{n-1}$ on the mask that has been corrected. Thereafter, for example the energy $E_{n-1}$ is compared with the energy $E_0$, which has been obtained. In accordance with the compared result, the mask pattern is corrected so that for example the energy $E_{n-1}$ becomes almost the same as the energy $E_0$. As a result, the space width $w_n$ on the mask that is corrected is given by the following formula (7).

$$w_n = w_{n-1} \times (E_0/E_{n-1}) \quad (7)$$

In addition, at this point, assuming that the pitch of lines that compose the mask pattern is denoted by p, the linewidth $L_n$ of the lines is given by the following formula (8).

$$L_n = p(1 - E_0/E_{n-1}) + L_{n-1}(E_0/E_{n-1}) \quad (8)$$

The difference $\Delta$ (between the space width $w_n$ on the mask that is corrected by n times and the space width $w_{n-1}$ on the mask that is corrected by (n-1) times is compared with a corrected grid size g that is the minimum size in which the pattern size or a pattern position is corrected (at step S105) When the difference (becomes the corrected grid size g or smaller, the mask pattern correction is completed. In other words, when the following formula (9) is satisfied, the correction of the mask pattern is completed.

$$\Delta = |w_n - w_{n-1}| \leq g \quad (9)$$

When the process is repeated by n times, the pattern size or pattern position of the mask pattern converges at the value of which the energy $E_n$ becomes the same as the energy $E_0$. In other words, when the process is repeated by n times, the correction accuracy is improved. It should be noted that the process does not always need to be repeated by n times. Instead, the correcting process can be completed after the fourth step has been completed.

When the mask pattern is corrected in the foregoing process, even if the exposure light is obliquely incident to the front surface of the mask, the energy of the near field light of which the exposure light is reflected or the energy of light at a distance from the front surface of the absorber layer by equal to or greater than twice the wavelength $\lambda$ of exposure light becomes almost the same as the energy of the exposure light that is vertically incident to the front surface of the mask. In other words, the corrected mask pattern allows an image in almost the same as that of the exposure light that is vertically incident to the mask to be exposed and transferred to the wafer.

Thus, even if the exposure light is obliquely incident to the front surface of the mask, when the mask pattern is corrected, an image in almost the same shape as that of the exposure light that is vertically incident to the mask can be exposed and transferred to the wafer. Thus, the influence of the obliquely incident effect, namely the deformation of transferred image on the wafer as the factor (c) can be removed. In other words, when the mask pattern is corrected in the foregoing process, the fidelity of a transferred image can be prevented from deteriorating against the obliquely incident effect. As a result, a desired (designed) image can be transferred. Thus, when the exposure mask is used, the performance of semiconductor devices produced by the lithography step using the EUV can be improved.

In the foregoing example, at least one of the pattern size and pattern position of the mask pattern is corrected. However, it should be noted that the present invention is not limited to the example. For example, when the film thickness of the absorber film that composes the mask pattern is corrected, the energies $E_1$ to $E_n$ can also become almost the same as the energy $E_0$. In addition, when the material of the absorber film that composes the mask pattern is selected and extinction coefficient of light of the absorber film is corrected, the energies $E_1$ to $E_n$ become almost the same as the energy $E_0$. In other words, it is thought that the correction of which the energies $E_1$ to $E_n$ become almost the same as the energy $E_0$ is performed by properly changing at least one of the pattern size and pattern position of the mask pattern, the film thickness of the absorber film, or the material of the absorber film or any combination of thereof.

It is though that the foregoing process is accomplished by an information processing unit that functions as a computer when the information processing unit executes a predetermined information processing program. In this case, it is assumed that data of the shape of a mask pattern and data of a linewidth of a transferred image on a wafer is inputted through an information input unit. However, part of these information may be obtained by a simulation that the information processing unit performs rather than by input from the outside. It is thought that an information processing program that accomplishes the process may be pre-installed to the information processing unit. Alternatively, the information processing program may be stored in a computer readable storing medium and provided. Alternatively, the information processing program may be distributed through a cable communication system or a wireless communication system.

Next, specific examples of the process of the master pattern correcting method will be described in detail. In the following description, the energy of light of which the exposure light is reflected is referred to as a near field energy. Of course, likewise, the energy of light obtained at a distance from the front surface of the absorber layer by equal to or smaller than the wavelength $\lambda$ of the exposure light can be applied to the near field energy.

[Description about Pre-Conditions]

Next, when an exposure light is obliquely incident to the mask, the pattern on the mask should be corrected in the following qualitative conditions: if the process constant of the formula (1) is k1=0.6 or smaller, the incident angle of the exposure light on the front surface of the mask is large or the film thickness of the absorber film is large. To practically identify them, an exposure mask having a mask structure shown in FIG. 3 and a mask pattern shown in FIG. 4 will be exemplified.

Figure 3:
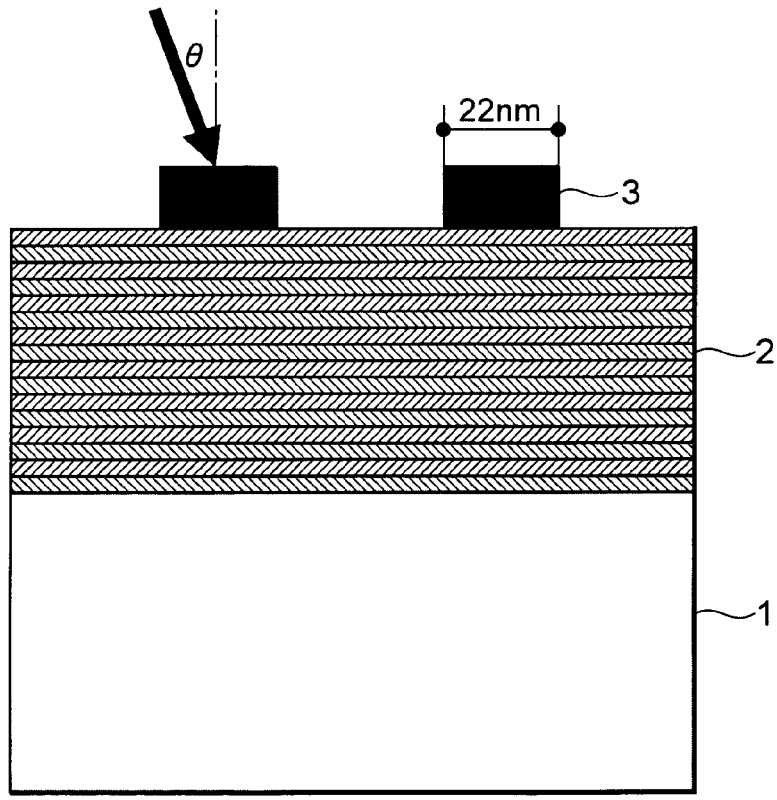
FIG. 3 is a schematic diagram showing an example of the structure of a mask describing the relation of permissible film thickness of an absorber film and a permissible incident angle of exposure light.
Figure 5B:
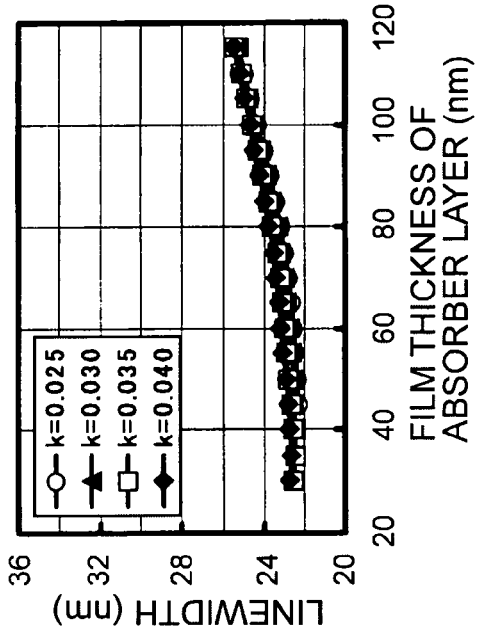
FIG. 5A, FIG. 5B, FIG. 5C, and FIG. 5D are graphs describing specific examples of exposed results of the mask shown in FIG. 3 and an exposure mask having the mask pattern shown in FIG. 4, in particular, the relation among the film thickness of the absorber film, the linewidth on the wafer, and the incident angle.
Figure 5D:
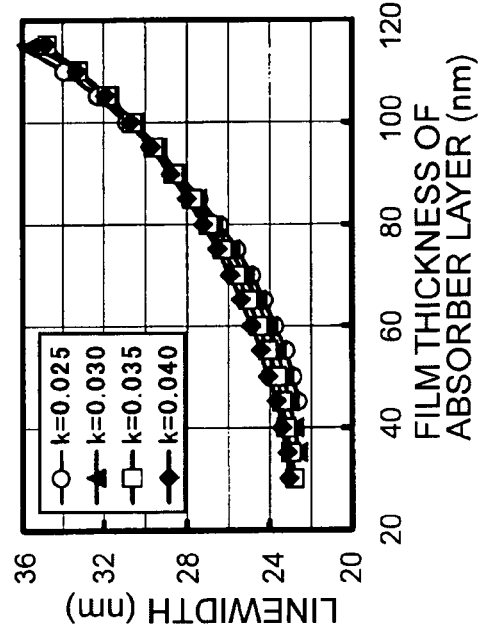
Figure 5A:
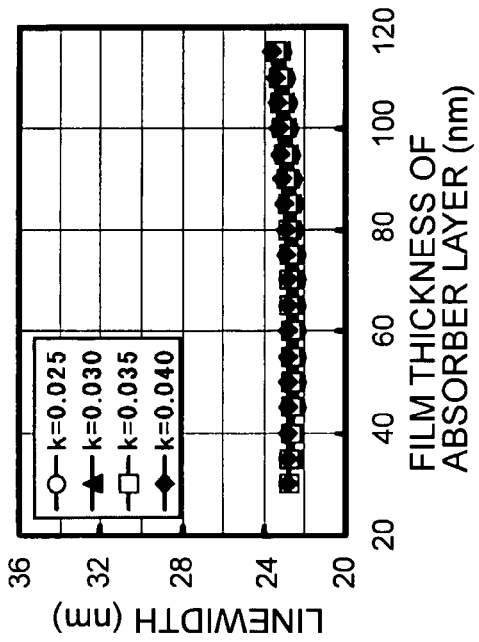
Figure 5C:
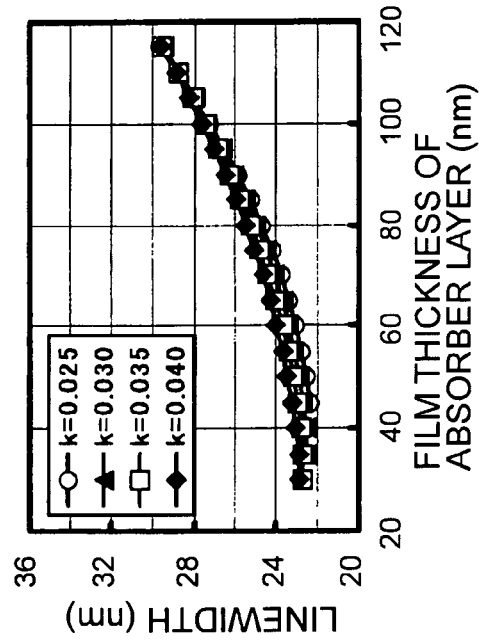

The mask shown in FIG. 3 is structured in the manner that a film of mask blank 2 is formed above a glass substrate 1. Above the film of mask blank 2, an absorber film 3 is formed. In this example, the absorber film 3 has a reflective index of 0.94 and an extinction coefficient k in the range from 0.025 to 0.040. The refractive index, which is 0.94, of the absorber film 3 is almost equal to the refractive index of each of Ta, Cr, and their compound used as a material of the absorber film 3. The extinction coefficient k, which is in the range from 0.025 to 0.040, is almost equal to the composite extinction coefficient of these materials and a material of a buffer film. When the linewidth is 22 nm and a projection optical system whose center wavelength of the exposure light is 13.5 nm and NA=0.30 is used, the process constant k1 of the formula (1) is 0.5. In addition, a 4× mask pattern having a pattern pitch of 176 nm and a linewidth of 88 nm shown in FIG. 4 causes a pattern having a pattern pitch of 44 nm and a linewidth of 22 nm to be formed on the wafer. Likewise, a 4× mask pattern having a pattern pitch of 352 nm and a linewidth 88 nm shown in FIG. 4 causes a pattern having a pattern pitch of 88 nm and a linewidth of 22 nm to be formed on the wafer.

FIG. 5A, FIG. 5B, FIG. 5C, and FIG. 5D are graphs describing specific examples of exposed results using these exposure masks. These graphs show the relation among the film thickness of the absorber film 3, the linewidth on the wafer, and the incident angle in the case that the extinction coefficient is 0.025, 0.030, 0.035, and 0.040, the incident angle of the exposure light is 4.48, 6.16, 7.49, and 8.38, the linewidth on the mask is 88 nm, and the pitch is 176 nm. The linewidth and the space width on the mask are not corrected.

In addition, each side of the mask pattern is perpendicular to the exposure light that is obliquely incident to the mask. The exposure amount is set assuming that the linewidth of the mask is 88 nm and the pitch is 352 nm. In other words, based on a sparse pattern layout, a linewidth of a dense layout is decided. As the optical conditions of exposure light, the numerical aperture of the lens is NA=0.30 and the size of the light source is δ=0.90. The size of light source δ=0.90 is defined so that when exposure light is vertically incident to the front surface of the mask and the film thickness of the absorber film 3 is around 100 nm, the linewidth of a dense layout pattern with an exposure amount in a sparse pattern layout becomes 22 nm.

These graphs show that as the film thickness of the absorber film 3 increases, the linewidth of the wafer tends to increase. Thus, it can be said that when the film thickness of the absorber film 3 is large, the pattern on the mask needs to be corrected. The tendency of which the linewidth increases becomes strong as the incident angle increases. On the other hand, this tendency does not largely depend on the extinction coefficient. Thus, it is thought that a permissible range of the film thickness of the absorber film 3 is designated for each incident angle so that a permissible amount of ±5% against a desired linewidth of 22 nm on the wafer, namely 22 nm±23.1 nm, is satisfied.

Figure 6:
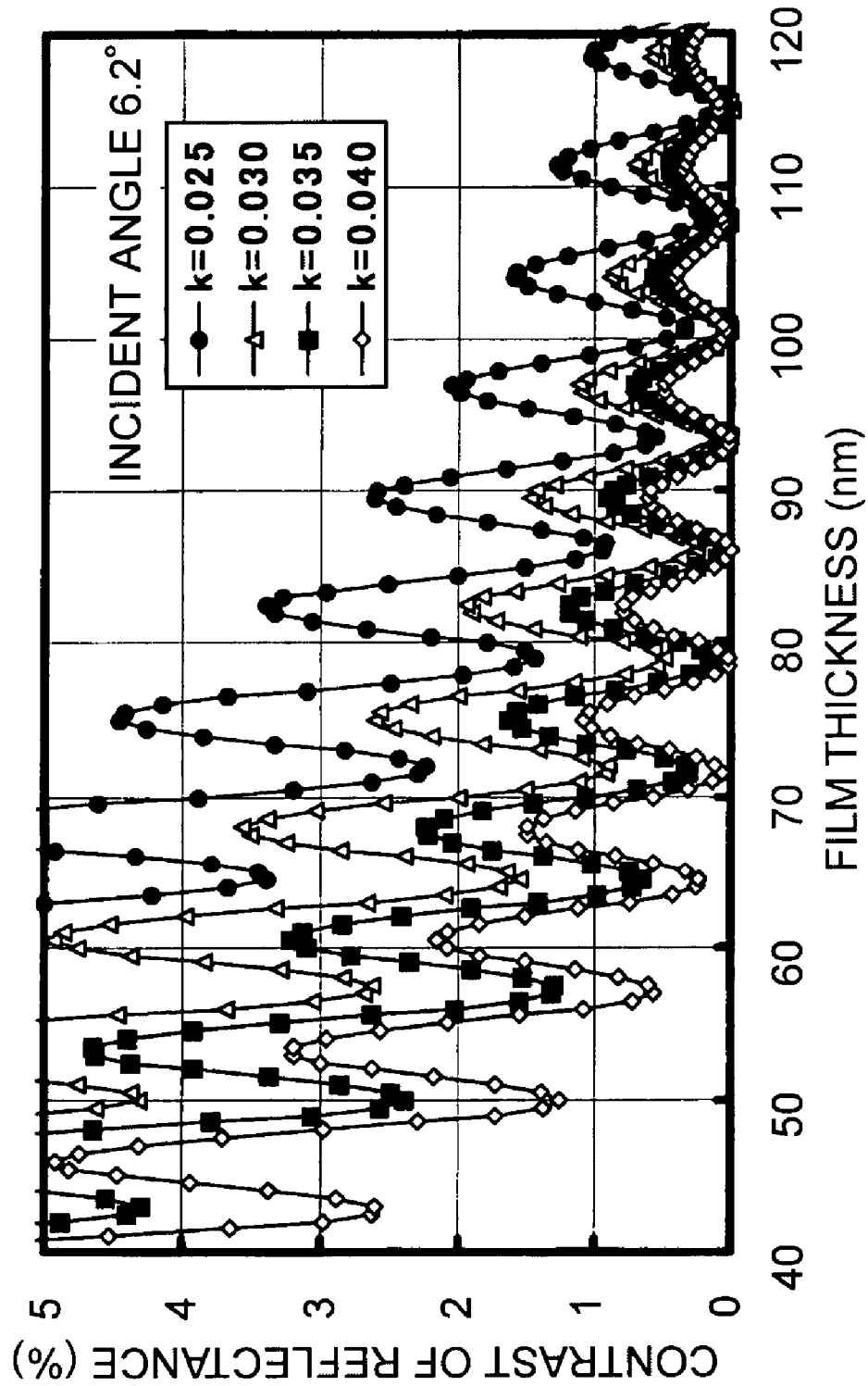
FIG. 6 is a graph describing a specific example of the relation between the contrast of reflectance of the front surface and the thickness of the absorber film, in particular, a condition of the absorber film necessary for satisfying a reflectance contrast of 1% or smaller.

It may be though that the film thickness of the absorber film 3 is designated with a contrast γ of the reflectance $R_M$ of the front surface of the film of mask blank 2 and the reflectance $R_A$ thereof. Specifically, although the contrast γ is defined by $γ=(R_A/R_M)×100$ (%), it is thought that the film thickness of the absorber film 3 may be designated so that the contrast γ becomes 1% or smaller. FIG. 6 is a graph describing a specific example of the relation of the contrast of reflectance of front surface of the mask and the film thickness of the absorber film 3. This graph shows that when the extinction coefficient k is 0.025, the film thickness of the absorber film 3 needs to be 86 nm or greater; when the extinction coefficient k is 0.030, the film thickness of the absorber film 3 needs to be 72 nm or greater; and when the extinction coefficient k is 0.040, the film thickness of the absorber film 3 needs to be 56 nm or greater. In other words, the graph shows that as the larger the extinction coefficient, the more the film thickness that satisfies the relation of contrast $γ≦1.0$ (%) can be decreased.

FIG. 7A, FIG. 7B, FIG. 7C, and FIG. 7D are graphs describing specific examples of conditions that satisfy both the permissible amount of the linewidth and the contrast value γ. In these graphs, the conditions that satisfy the both are obtained as shadow areas. In other words, the larger the extinction coefficient, the more the permissible area widens. However, when an exposing unit having NA=0.30 necessary for exposing a pattern having a linewidth of 22 nm on a wafer is used, considering that the incident angle to the mask is 7° or greater, there is no condition that satisfies both the permissible amount of the linewidth and the contrast value γ. This is because on the assumption that each side of a mask pattern is perpendicular to exposure light that is obliquely incident to the mask, the exposure amount is set for a linewidth of 88 nm and a pitch of 352 nm on the mask. The reason of which there is no condition that satisfies both the values will be described with respect to the near field energy on the mask.

Figure 8A:
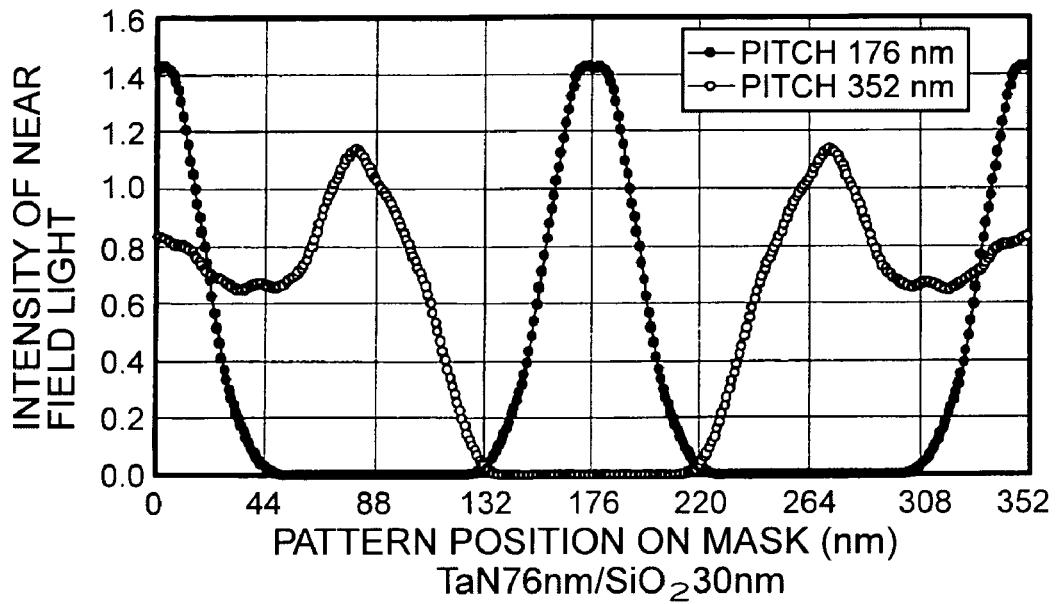
FIG. 8A and FIG. 8B are graphs describing specific examples of results of the distribution of the light intensities on the mask.
Figure 8B:
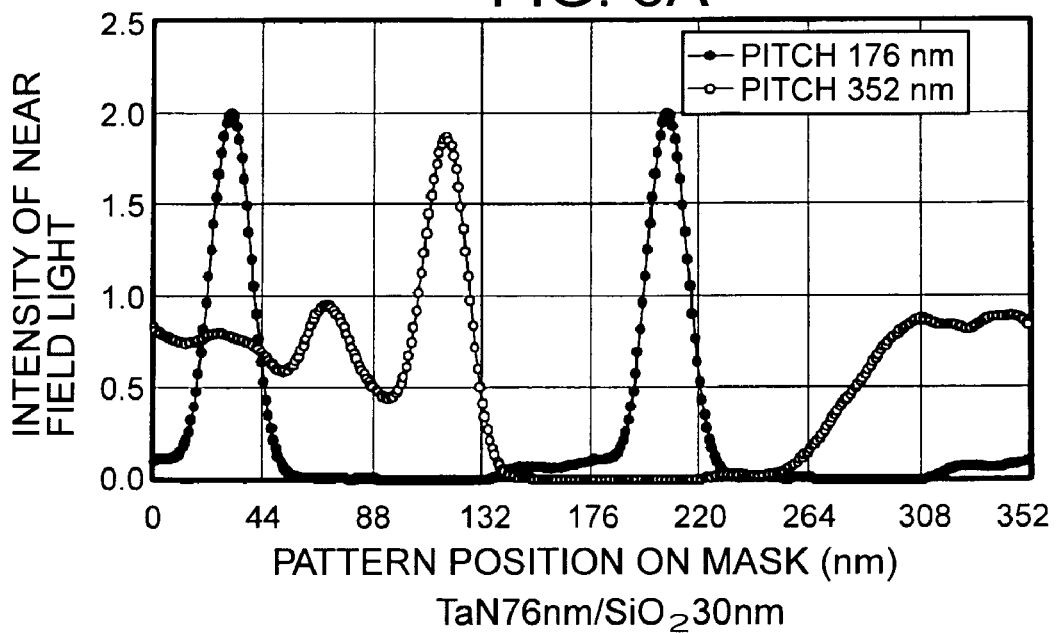
Figure 9A:
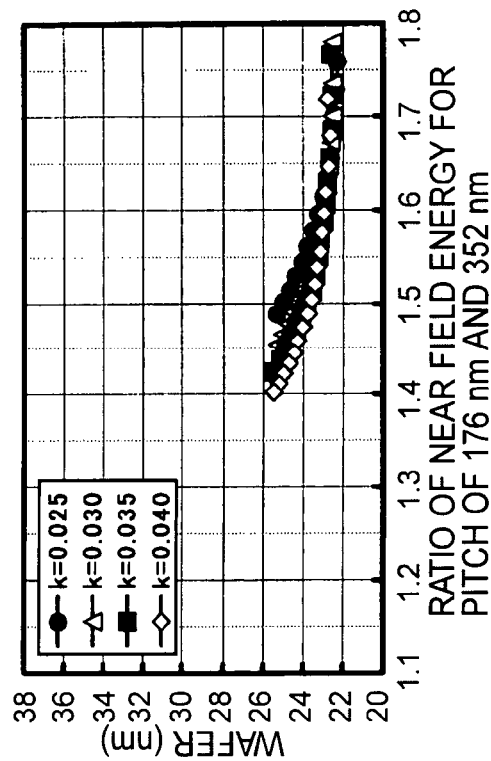
FIG. 9A, FIG. 9B, FIG. 9C, and FIG. 9D are graphs describing specific examples of the relation between the ratio of the near field energies on the mask and the linewidths on the wafer.
Figure 9B:
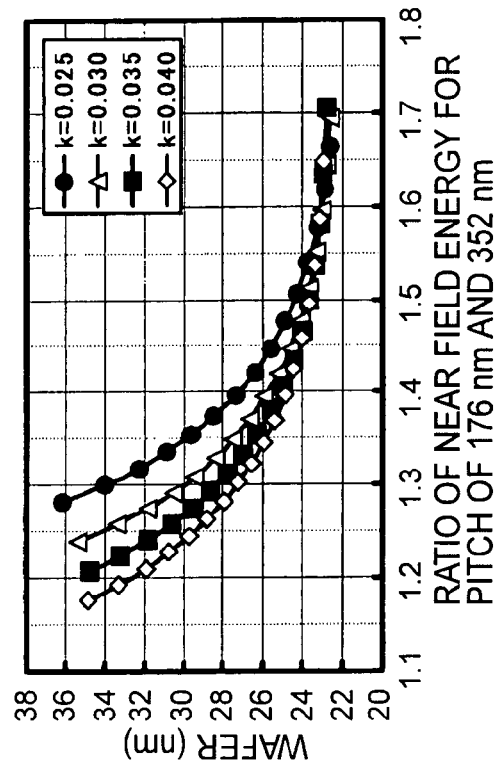
Figure 9C:
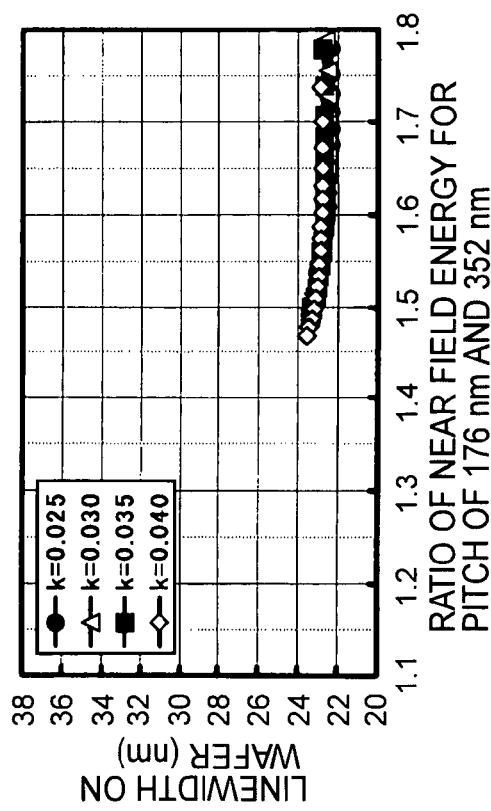
Figure 9D:
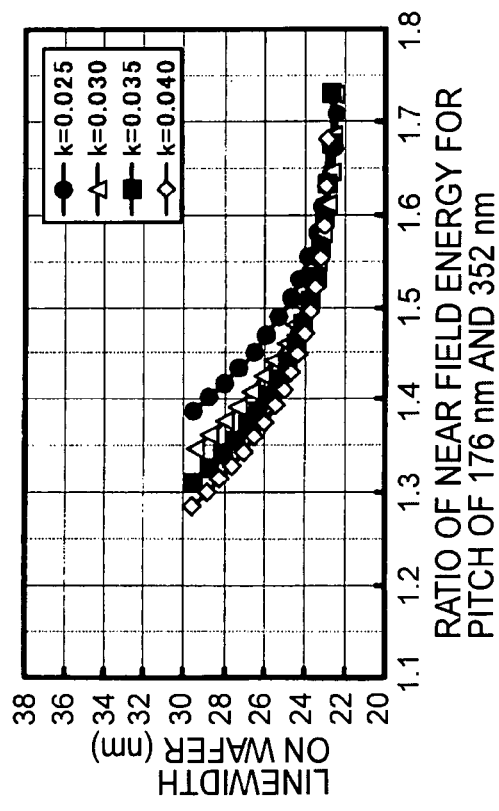

To obtain near field energy, the distribution of light intensities J(x) in the near field on the mask is obtained for two cycles for a mask having a linewidth of 88 nm and a pitch of 176 nm and for one cycle for a mask having a linewidth of 88 nm and a pitch of 352 nm. FIG. 8A and FIG. 8B are graphs describing specific examples of the obtained results. FIG. 8A shows the distribution of light intensities in the near field on the mask in the case that incident angle is 0°, the exposure light being vertically incident to the front surface of the mask. FIG. 8B shows the distribution of light intensities in the near field on the mask in the case that incident angle is 7.84°, the exposure light being obliquely incident to the front surface of the mask. The energy E in the near field light on the mask is obtained by definitely integrating these distributions of light intensities J(x) in the near field of the mask as the following formula (10).

$$E=\int_0^{352} J(x)dx \quad (10)$$

Now, it is assumed that the energy of the near field on a mask having a linewidth of 88 nm and a pitch of 176 nm is denoted by Edense and that the energy of the near field on a mask having a linewidth of 88 nm and a pitch of 352 nm is denoted by Esparse. In addition, the ratio of these energies is denoted by Edense/Esparse. The relation between the energy ratio Edense/Esparse and the linewidth on the wafer with a dense layout pattern of a mask having a linewidth of 88 nm and a pitch of 176 nm is plotted as shown in FIG. 9A, FIG. 9B, FIG. 9C, and FIG. 9D. FIG. 9A, FIG. 9B, FIG. 9C, and FIG. 9D are graphs describing specific examples of the relation between the energy ratio and the linewidth on the wafer in the case that the extinction coefficient is 0.025, 0.030, 0.035, and 0.040 and the incident angle is 4.48°, 6.16°, 7.49°, and 8.38°. These graphs shows that as the ratio of near field energies on the mask decreases, the linewidth on the wafer increases. The tendency of which the linewidth on the wafer increases becomes strong as the incident angle becomes large. In addition, it is clear that as the extinction coefficient is smaller, the influence of the near field energy on the mask against the linewidth on the wafer becomes strong.

Figure 10B:
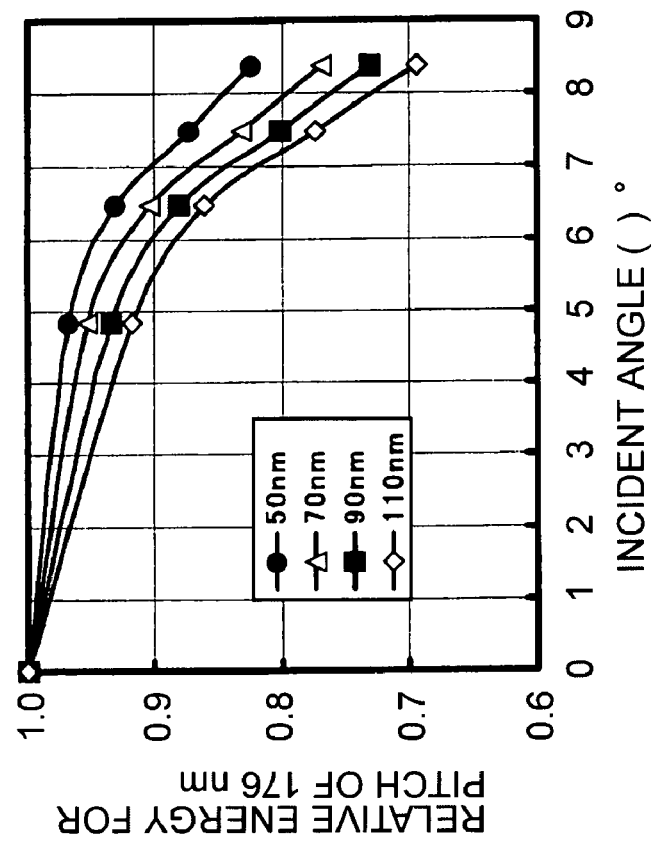
FIG. 10A and FIG. 10B are graphs describing specific examples of relative comparison of the near field energy on the mask at an incident angle of 0° (vertical incident) and near field energies on the mask at other incident angles (oblique incident)
Figure 10A:
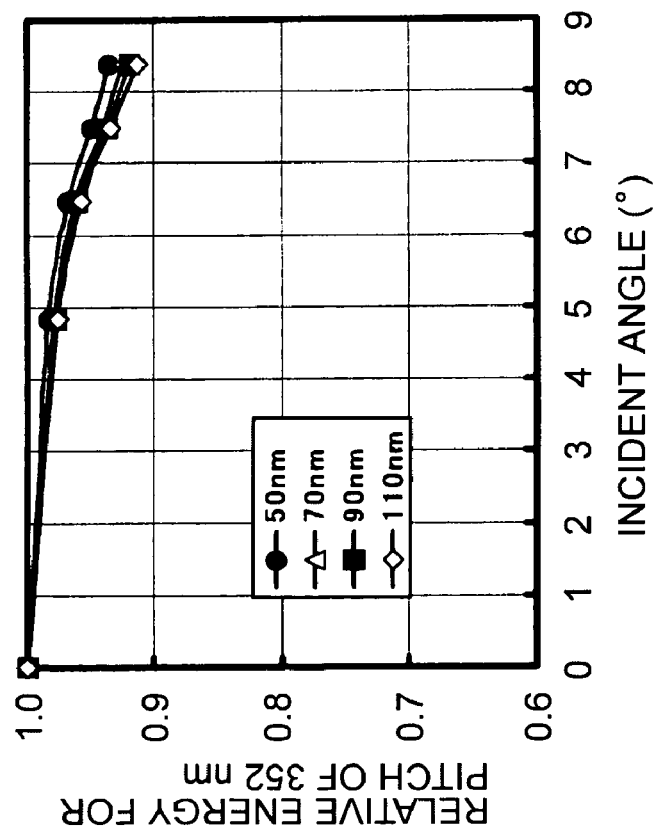

The near field energy on a mask that has a linewidth of 88 nm and a pitch of 176 nm and to which exposure light is vertically incident is denoted by Enormal_sparse. The near field energy on a mask that having a linewidth of 88 nm and a pitch of 352 nm and to which exposure light is vertically incident is denoted by Enormal_sparse. The ratio of these energies and energy Edense or Esparse are denoted by Edense/Enormal_dense and Esparse/Enormal_sparse. When the energy ratios Edense/Enormal_dense and Esparse/Enormal_sparse are plotted, graphs as shown in FIG. 10A and FIG. 10B are obtained. FIG. 10A and FIG. 10B are graphs describing specific examples of relatively comparison of the near field energy on the mask at an incident angle of 0° (vertical incident) and the near field energies on the mask at other incident angles under the condition of extinction coefficient k=0.040. These graphs show that with respect to a sparse layout pattern, even if the incident angle increases, the change of the ratio of the near field energies on the mask is small and that the difference between the near field energy on the mask to which exposure light is vertically incident and the near field energy on the mask to which exposure light is obliquely incident is small. On the other hand, with respect to a dense layout pattern, as the incident angle increases, the change of the ratio of the near field energies on the mask becomes large. In particular, when the incident angle is 6° or greater, the near field energy on the mask remarkably decreases. The decrease of the near field energy on the mask causes the contrast of the light intensity on the wafer to decrease. As a result, the linewidth increases and the resolution decreases.

[Description of Correction]

Next, the foregoing phenomenon has become clear. Next, a mask pattern is corrected so that the following formulas (11) and (12) are satisfied.

$$Edense/Enormal\_dense \approx 1 \quad (11)$$

$$Esparse/Enormal\_sparse \approx 1 \quad (12)$$

Namely, when exposure light is incident to the mask, the pattern on the mask is corrected so that the near field energy on the mask matches the near field energy on the mask to which exposure light is vertically incident. It is thought that the grid size to be corrected is 1 nm on the 4× mask.

Figure 11:
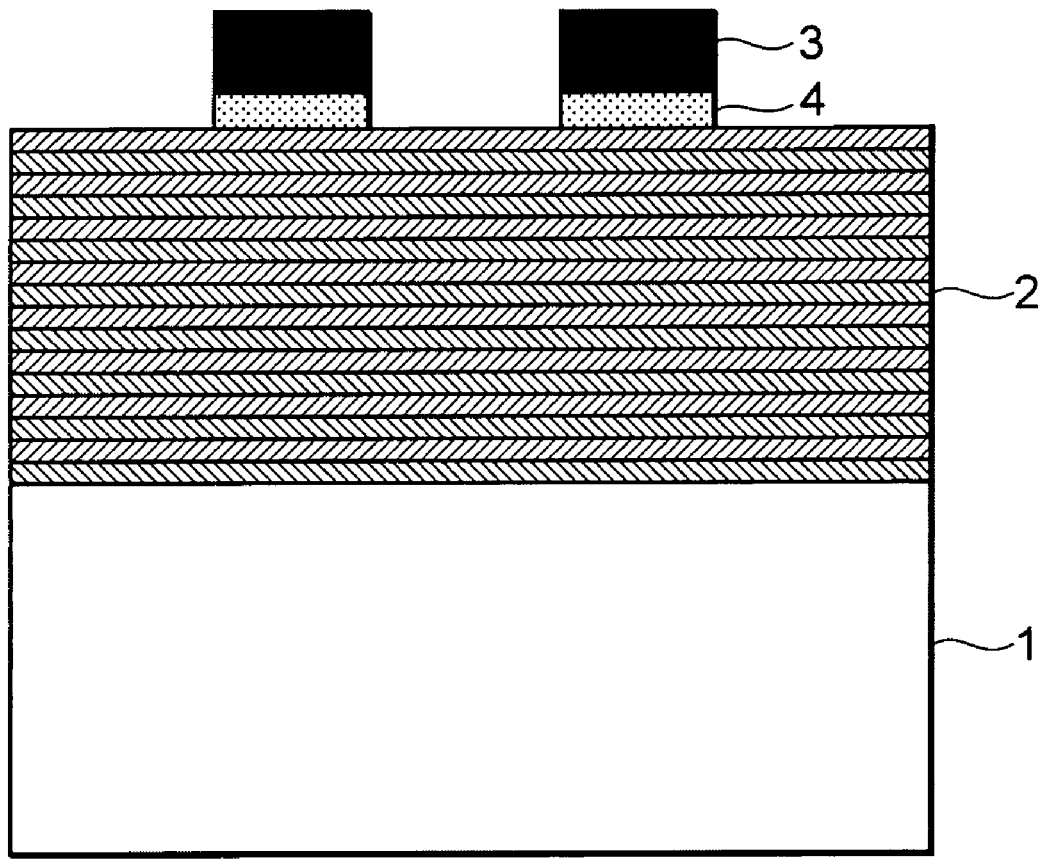
FIG. 11 is a schematic diagram showing an example of the structure of the exposure mask to be corrected.

FIG. 11 is a schematic diagram showing an example of the structure of an exposure mask to be corrected. The mask shown in FIG. 11 is structured in the manner that an absorber film 3 is formed above a glass substrate 1 and a film of mask blank 2. The absorber film 3 is made of TaN having a thickness of 76 nm. In addition, a buffer film 4 is formed between the film of mask blank 2 and the absorber film 3. The buffer film 4 is made of $SiO_2$ and has a thickness of 30 nm. EUV is exposed to the mask under the optical conditions of which the aperture numeral NA of the lens NA is 0.30, the size σ of the light source is 0.90, and the oblique incident angle to the front surface of the mask is 7.5° to 7.8°. In this exposure mask, the extinction coefficient of the buffer film 4 is 0.011, whereas the extinction coefficient of the absorber film 3 is 0.032. The total thickness of the buffer film 4 and the absorber film 3 is 106 nm and the composite extinction coefficient is 0.026. Thus, it is clear that the exposure mask shown in FIG. 11 largely deviates from the permissible ranges of the thickness of the absorber film and the incident angle shown in FIG. 7. In other words, to obtain the desired fidelity of the transferred image on the wafer, the pattern on the mask needs to corrected.

The pattern on the mask needs to be corrected in accordance with the process shown in FIG. 1 so that the formula (11) and the formula (12) are satisfied. In this example, it is assumed that a dense pattern having a linewidth of 88 nm and a pitch of 176 nm (a space width of 88 nm) and a sparse pattern having a linewidth of 88 nm and a pitch of 352 nm (a space width of 264 nm) are used. In addition, it is assumed that the oblique incident angle to the mask is 7.8°. FIG. 12A, assuming that the near field energy on the mask to which the exposure light is vertically incident is defined as "1," shows relative amounts of near field energies on the mask to which the exposure light is obliquely incident corresponding to the number of times the mask pattern is corrected. FIG. 12B show space widths on the mask to which the exposure light is vertically incident and those on the mask to which exposure light is obliquely incident corresponding to the number of times the mask pattern is corrected. In this case, the linewidth is defined by substituting the space width from the pitch. The graphs show that a dense pattern having a pitch of 176 nm converges when the pattern is corrected three times and that a sparse pattern having a pitch of 352 nm converges when the pattern is corrected one time.

Figure 13A:
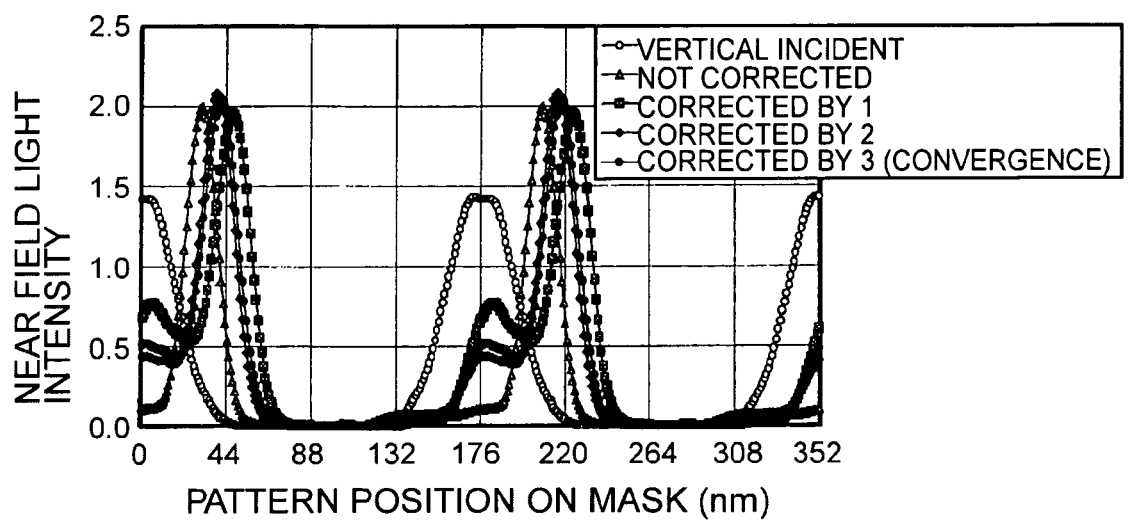
FIG. 13A and FIG. 13B are graphs describing a specific example of a process for correcting the intensity of the near field light on the exposure mask shown in FIG. 11 corresponding to the number of times the mask pattern as a dense pattern shown in FIG. 4 is corrected and a specific example of a process for correcting the distribution of the light intensities on the wafer corresponding to the number of times the mask pattern is corrected.
Figure 13B:
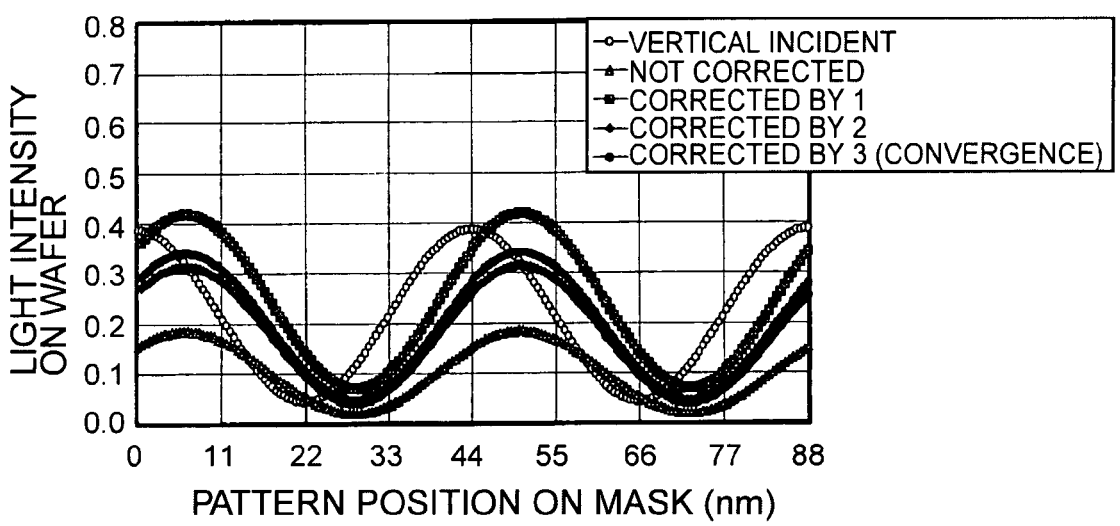
Figure 15:
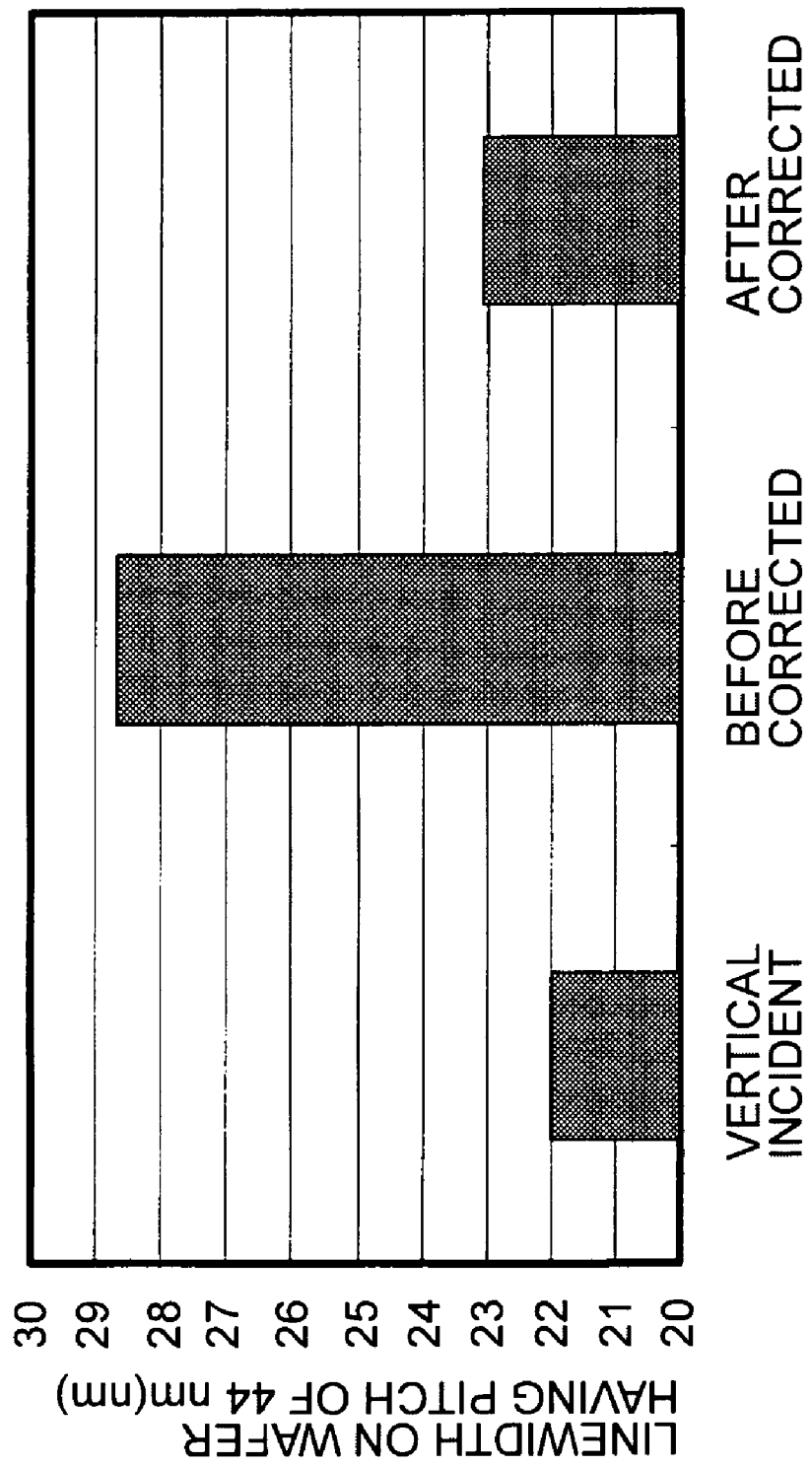
FIG. 15 is a graph describing the comparison of the linewidth on the wafer in the case that the exposure light is vertically incident to the front surface of the mask, that in the case that the exposure light is obliquely incident to the front surface of the mask, and that in the case that the exposure light is obliquely incident to the front surface of the mask and the light intensity is corrected, with the exposure light amount for a linewidth of 22 nm on the wafer using the mask having a pitch of 352 nm at an incident angle of 7.8°, the exposure light amount being corrected for the mask having a pitch of 176 nm.

The process for correcting the distribution of the near field light intensities on the mask and the process for correcting the distribution of the light intensities on the wafer are shown in FIG. 13A, FIG. 13B, FIG. 14A, and FIG. 14B. FIG. 13A and FIG. 13B show the processes for a dense pattern. FIG. 14A and FIG. 14B show the process for a sparse pattern. FIG. 15 shows the comparison of the linewidth on the wafer in the case that the exposure light is vertically incident to the front surface of the mask, that in the case that the exposure light is obliquely incident to the front surface of the mask, and that in the case that the exposure light is obliquely incident to the front surface of the mask and the light intensity is corrected. The graph clearly shows that when the desired linewidth on the wafer is 22 nm, the linewidth on the wafer is 28.7 nm in the case that the light intensity is not corrected, and the linewidth on the wafer is 23.1 in the case that the intensity is corrected.

Figure 16:
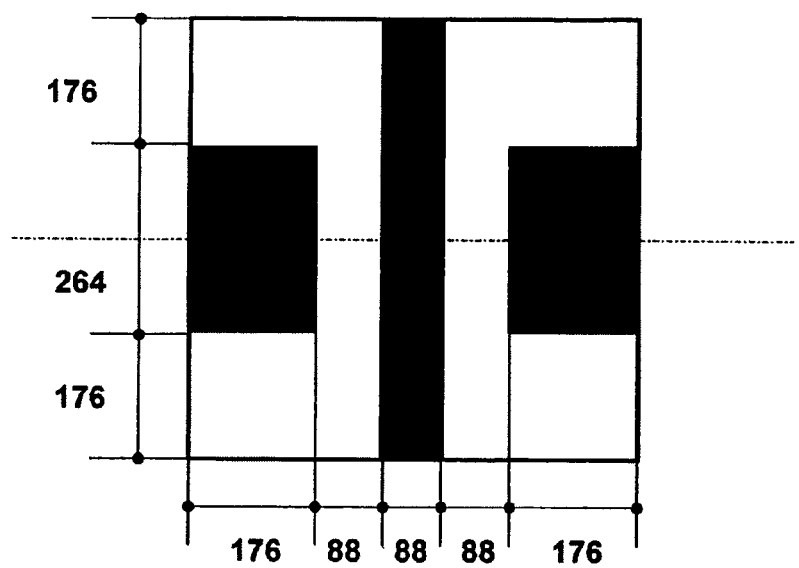
FIG. 16 is a schematic diagram describing an example of a designed layout of a 4× mask pattern to be corrected.

Next, a specific example of which a more complicated pattern is corrected. FIG. 16 is a schematic diagram describing an example of a designed layout on a 4× mask to be corrected. The pattern of the mask is composed of a straight line of 88 nm and two squares having a width of 352 nm, the straight line and the two squares being spaced apart by 88 nm each. A specific pattern to be corrected is formed by many cycles of the pattern. In other words, the pattern on the mask shown in FIG. 16 is one cycle of the specific pattern. It is assumed that optical conditions are NA=0.30, σ=0.90, and obliquely incident angle=7.6°.

Figure 17A:
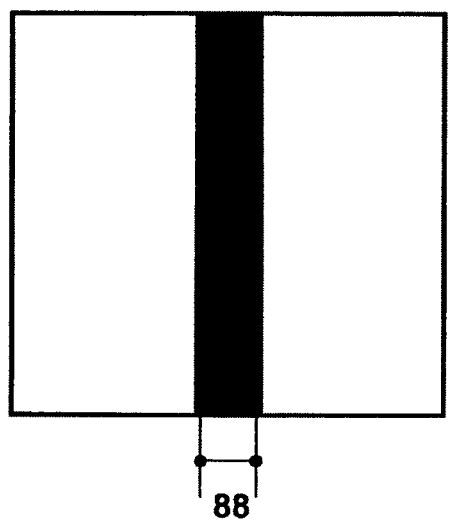
FIG. 17A and FIG. 17B are schematic diagrams describing examples of model patterns used to correct the pattern shown in FIG. 16.
Figure 17B:
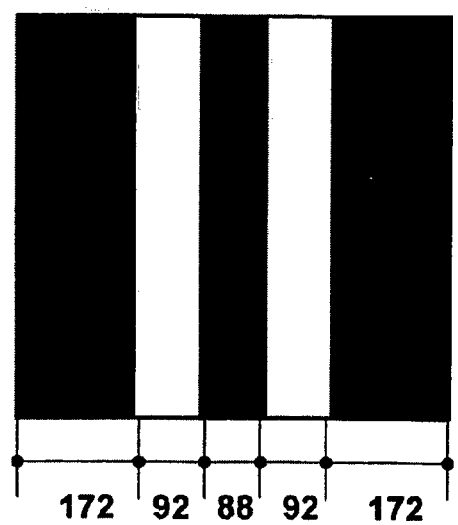

To correct the pattern on the mask, a model pattern thereof is corrected. FIG. 17A and FIG. 17B are schematic diagrams showing examples of model patterns. In the model patterns, the exposure light is vertically incident to the front surface of the mask. As shown in FIG. 17B, it is assumed that the OPC has been performed for the model pattern composed of two dense spaces. FIG. 18A and FIG. 18B are schematic diagrams describing the results of which the model patterns have been corrected against an incident angle of 7.6°. FIG. 19A and FIG. 19B show a mask pattern corrected with the corrected values shown in FIG. 18A and FIG. 18B and a result of which the mask pattern is exposed. As are clear from FIG. 19A (mask pattern after corrected) and FIG. 19B (transfer image on wafer), when the light is exposed to the wafer with the corrected mask pattern, a good transferred image that satisfies an allowable condition of a linewidths of 22 nm ±1.1 nm can be obtained.

Figure 20B:
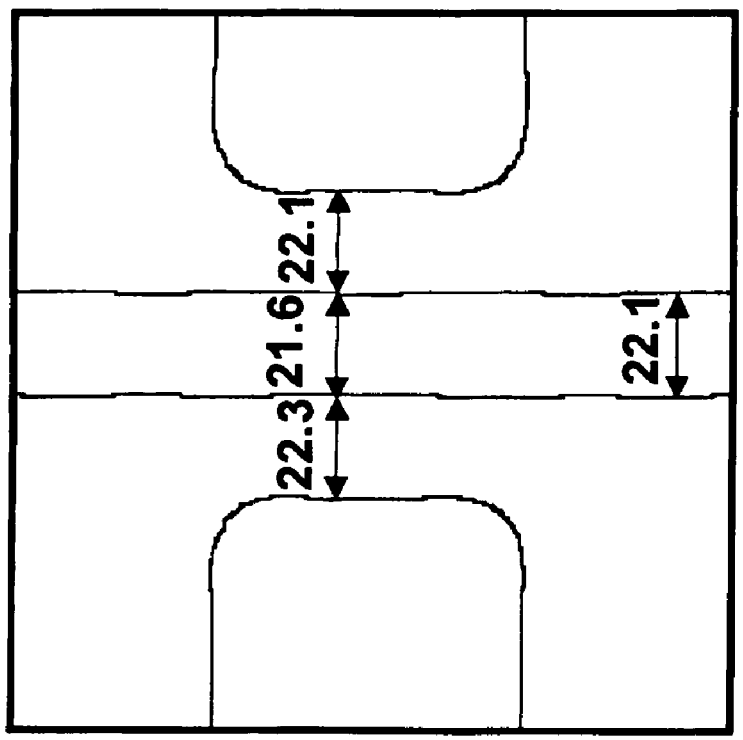
FIG. 20A and FIG. 20B are schematic diagrams showing specific examples of a mask pattern and an image transferred on a wafer as a corrected result not based on the present invention.
Figure 20A:
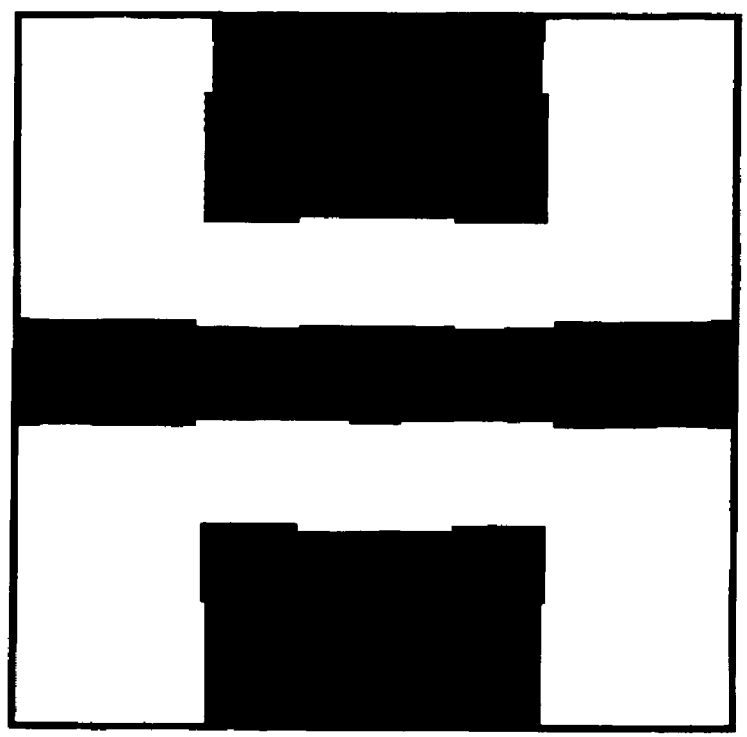

Next, for comparison, corrected results that are not based on the present invention will be described in brief. FIG. 20A and FIG. 20B are schematic diagrams describing examples of corrected results that are not based on the present invention. In the examples, under the condition of which exposure light is incident to the mask at an incident angle of 7.6°, the amount of the exposure light is set so that with a mask having a linewidth of 88 nm and a pitch of 352 nm, a linewidth of 22 nm is obtained on the wafer. Under the condition, a transferred image is obtained on the wafer. In addition, a transferred image of which edge positions of the mask pattern are moved is obtained on the wafer. With these transferred images, a mask error factor (MEEF) is obtained in accordance with the following formula (13). In addition, a corrected value C on the mask for a desired edge coordinate position $Xno_{wafer}$ is obtained in accordance with the following formula (14). The grid size is repeatedly corrected until the relation of $C \leq g \times MEEF$ is satisfied where g represents the corrected grid size. The corrected grid size is 1 nm on the 4× mask.

$$MEEF = |\{m \times (\Delta Xp_{wafer} - \Delta Xn_{wafer})\}/(\Delta Xp_{mask} - \Delta Xn_{mask})| \quad (13)$$

$$C = \{M \times (Xno_{wafer} - Xn_{wafer})\}/MEEF \quad (14)$$

In the formulas (13) and (14), reference codes $+\Delta Xp_{mask}$ and $-\Delta Xn_{mask}$ represent the shift amounts of the edge positions of the mask pattern. Reference codes $+\Delta Xp_{wafer}$ and $-\Delta Xn_{wafer}$ represent the shift amounts of the edge positions of the pattern on the wafer against the shift amounts of $+\Delta Xp_{mask}$ and $-\Delta Xn_{mask}$. In the formula (13), m represents the magnification of the mask.

Figure 21A:
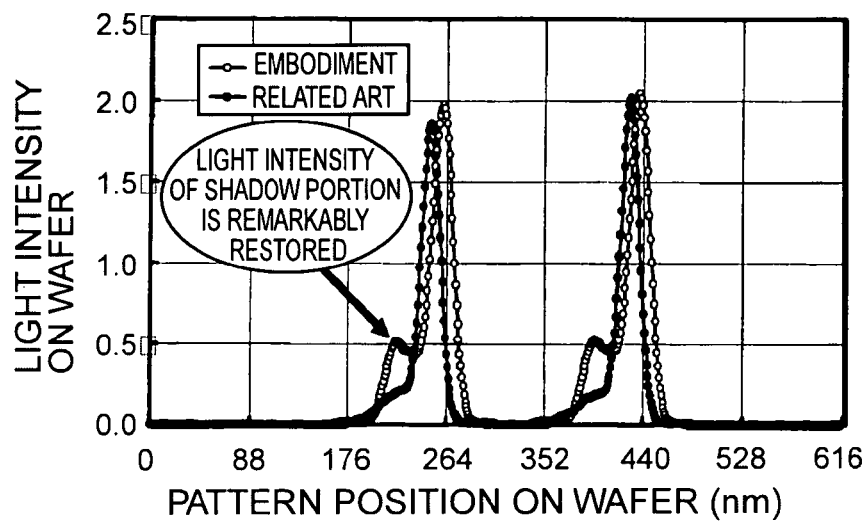
FIG. 21A and FIG. 21B are graphs describing specific examples of the distribution of the near field light intensities on the mask along the center line of the pattern shown in FIG. 16 and the distribution of the light intensities on the wafer.
Figure 21B:
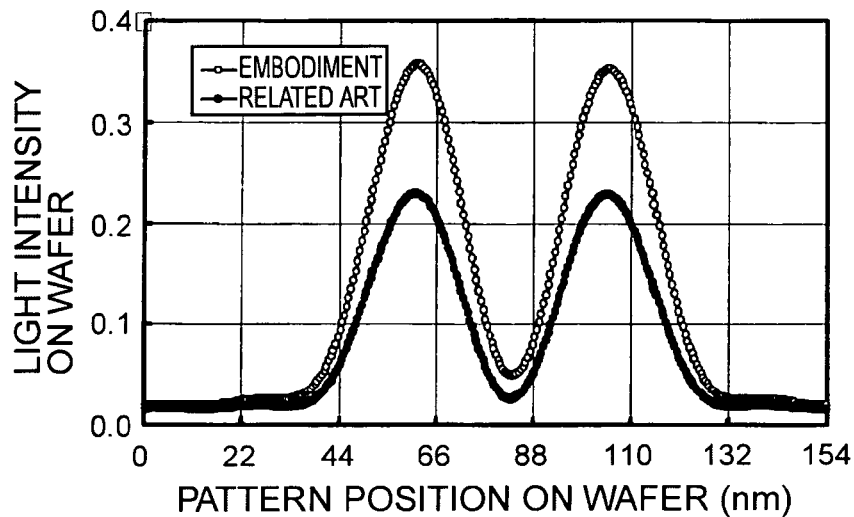

As are clear from FIG. 20A (mask pattern after corrected) and FIG. 20B (transfer image on wafer), the corrected result of the mask pattern obtained in this process (hereinafter this result is referred to as "the related art") has a complicated shape. On the other hand, as are clear from FIG. 19A and FIG. 19B, the corrected result based on the present invention (this result is referred to as "the embodiment") has a shape simpler than the corrected result of the related art. When the distribution of light intensities on the wafer of the related art is compared with that of the embodiment, the following result is obtained. FIG. 21A and FIG. 21B show specific examples of the distribution of the near field light intensities on the mask and the distribution of the light intensities on the wafer along the centerline of the pattern shown in FIG. 16. FIG. 21A clearly shows that when the distribution of the near field light intensities on the mask of the related art is compared with that of the embodiment, the light intensity of the shadow portion of the absorber film 3 of the embodiment is greater than that of the related art. In addition, the near field energy on the mask of the embodiment is greater around 1.2 times than that of the related art. In addition, FIG. 21B clearly shows that the distribution of the light intensities on the wafer of the embodiment is greater than that of the related art.

Figure 22A:
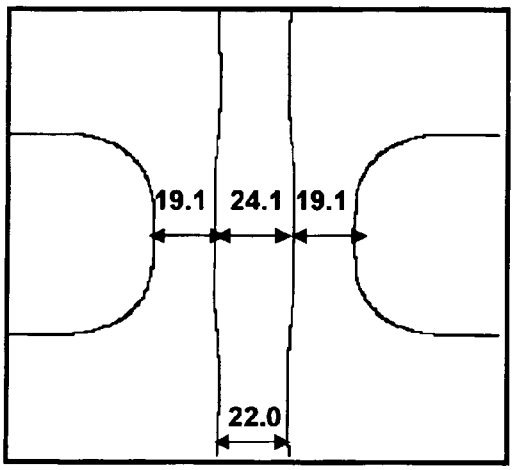
FIG. 22A and FIG. 22B are schematic diagrams describing examples of a mask pattern and a transferred image on the wafer in the case that the pattern shown in FIG. 16 is corrected by nearly matching the near field energy on the mask to which the exposure light is incident at an incident angle of 7.6° with the near field energy on the mask to which the exposure light is incident at an incident angle of 0° (vertical incident), the obtained mask pattern shown in FIG. 19A being exposed under the conditions of NA=0.25 and σ=0.70 (process factor k1=0.4)
Figure 22B:
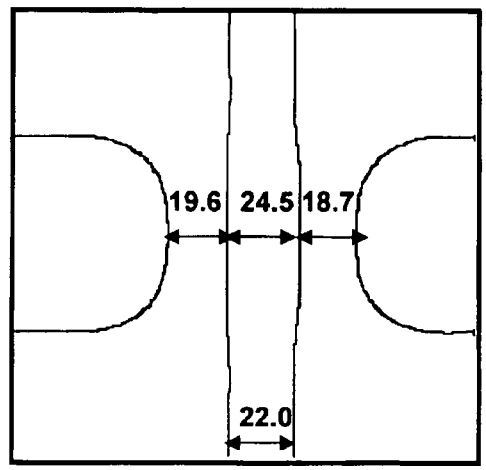

According to this embodiment, the mask pattern is corrected so that the near field energy on the mask to which exposure light is obliquely incident is almost matched with the near field energy on the mask to which the exposure light is vertically incident. Thus, the mask pattern can be corrected regardless of the conditions of the projection optical system. Thus, when optical conditions are different, the pattern on the wafer in the case that the exposure light is obliquely incident to the front surface of the mask is almost matched with that in the case that the exposure light is vertically incident to the front surface of the mask. FIG. 22A and FIG. 22B are schematic diagrams describing examples of shapes of transferred images on wafers in the case that the wafers are exposed under the optical conditions of NA=0.25 and σ=0.70 with the pattern on the mask shown in FIG. 19A. As shown in FIG. 22A, when the incident angle is 0°, the NA becomes small. As the process factor k1 of the formula (1) becomes 0.4, the resolution deteriorates. Due to the influence of the optical proximity effect, the pattern deforms. In addition, as shown in FIG. 22B, like the case of which the incident angle is 0°, the shape of the transferred image on the wafer in the case that the exposure light is incident at an incident angle of 7.6° to the mask corrected with near field energy on the mask deforms due to the influence of the optical proximity effect. In other words, although the influence due to the obliquely incident light is corrected, the influence of the optical proximity effect remains.

Figure 23A:
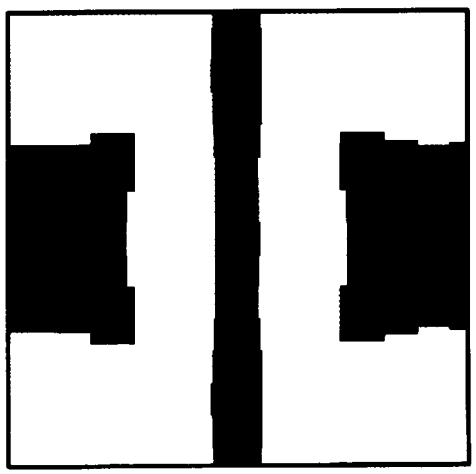
FIG. 23A and FIG. 23B are schematic diagrams showing specific examples of a mask pattern and a transferred image on the mask in the case that after the transferred images shown in FIGS. 22A and 22B are obtained, the mask pattern is corrected under the condition of incident angle=7.6° in the related art.
Figure 23B:
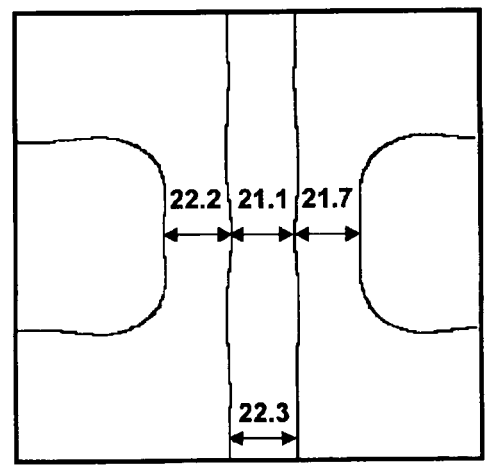

Thus, even if the mask pattern is corrected according to the embodiment and the fidelity of the transferred image on the wafer is prevented from deteriorating against the influence of the oblique incident effect, it is preferred that the pattern should be corrected by a conventional method such so as to further improve the fidelity of the transferred image on the wafer. FIG. 23A (mask pattern after corrected) and FIG. 23B (transfer image on wafer) show specific examples of the results of which the influence of the optical proximity effect is further removed.

When the near field energy on the mask to which the exposure light is vertically incident is obtained, reference near field energy may be obtained with a pattern on the mask on which the OPC has been performed. FIG. 24A (mask pattern after corrected) and FIG. 24B (transfer image on wafer) are schematic diagrams describing specific examples of the results of which the OPC has been performed for a model pattern on the mask to which the exposure light is vertically incident under the conditions of NA=0.25 and σ=0.70. FIG. 25A (mask pattern after corrected) and FIG. 25B (transfer image on wafer) are schematic diagrams describing specific examples of a corrected mask pattern and a transferred image when the near field energy on the mask to which the exposure light is vertically incident and for which the OPC is performed is almost matched with that on the mask to which the exposure light is incident at an incident angle of 7.6°. When the results shown in FIG. 24A and FIG. 24B are compared with the results shown in FIG. 25A and FIG. 25B, it is clear that they are almost matched.

Figure 26:
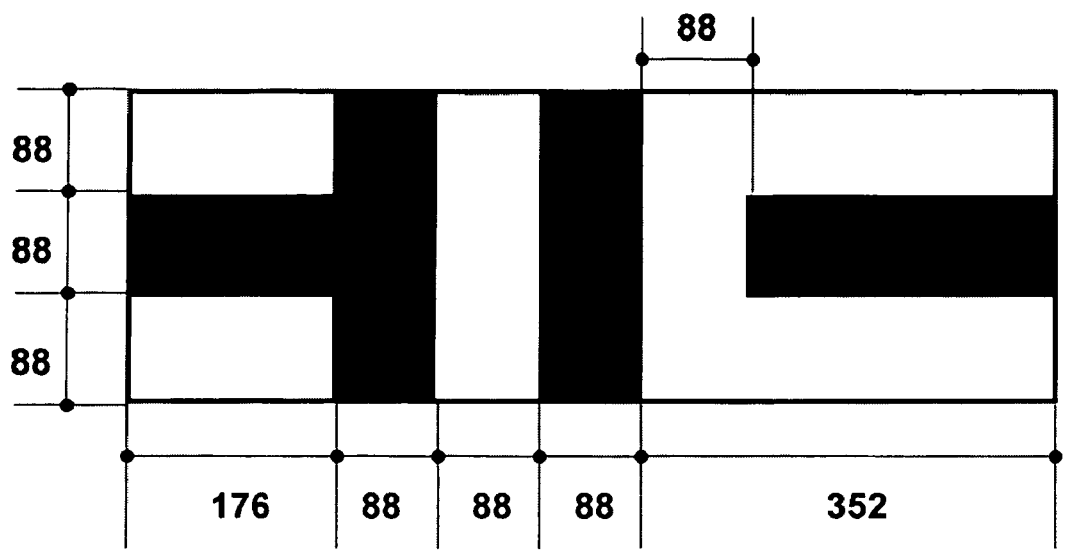
FIG. 26 is a schematic diagram describing another example of a designed layout of a 4× mask pattern to be corrected.

Next, another specific example will be described. FIG. 26 is a schematic diagram describing another example of a designed layout of a pattern on a 4× mask to be corrected. A T-shaped pattern having a width of 88 nm is formed on the 4× mask. A specific pattern to be corrected is formed by many cycles of the pattern. In other words, the pattern on the mask shown in FIG. 26 is one cycle of the specific pattern. It is assumed that optical conditions are NA=0.30, σ=0.90, and obliquely incident angle=7.8°.

Figure 27:
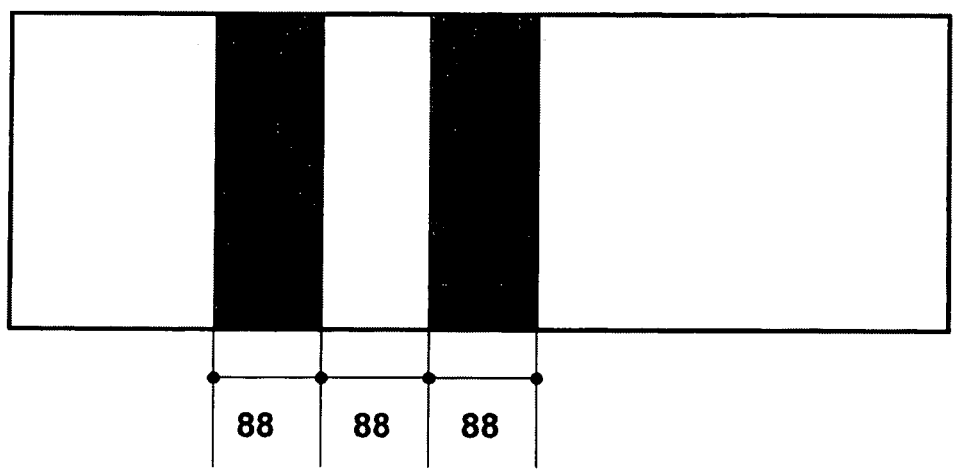
FIG. 27 is a schematic diagram describing an example of a model pattern used to correct a model base that is used to correct the pattern shown in FIG. 26.
Figure 28:
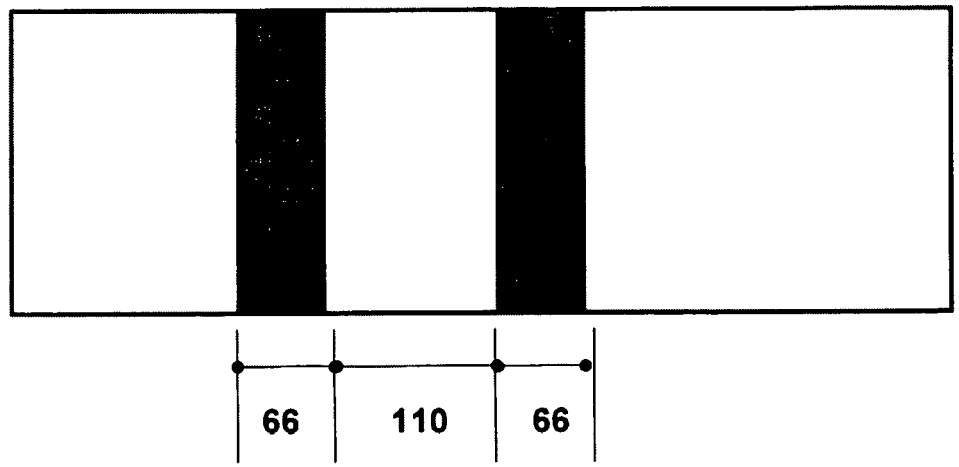
FIG. 28 is a schematic diagram describing a corrected result for the model pattern shown in FIG. 27 while providing exposure light conditions of NA=30, σ=0.90, and the exposure light being incident to the mask at an incident angle of 7.8°.
Figure 29A:
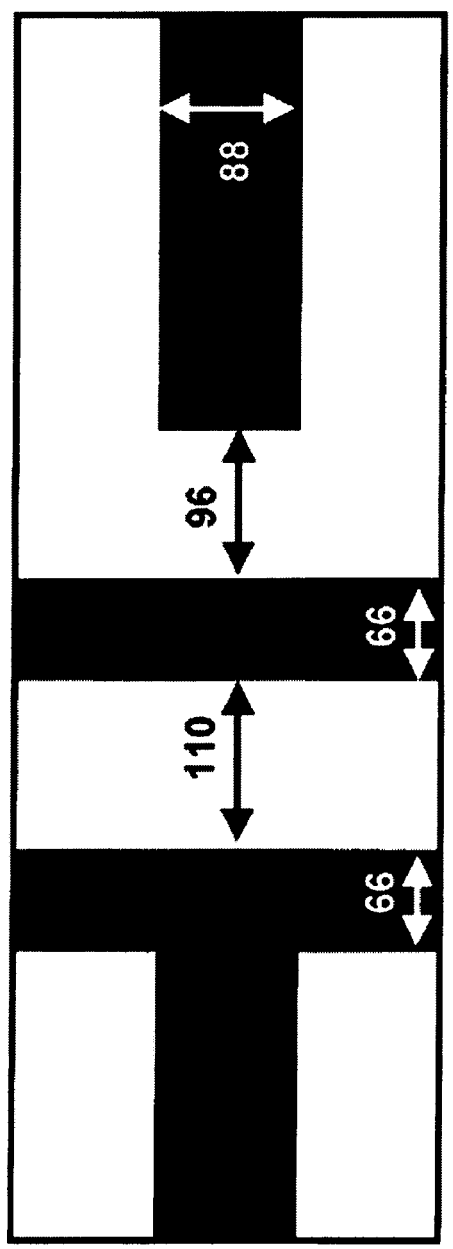
FIG. 29A and FIG. 29B are schematic diagrams describing specific examples of a mask pattern corrected with the corrected result shown in FIG. 28 and a transferred image on the wafer as a result of which the mask pattern is exposed.
Figure 29B:
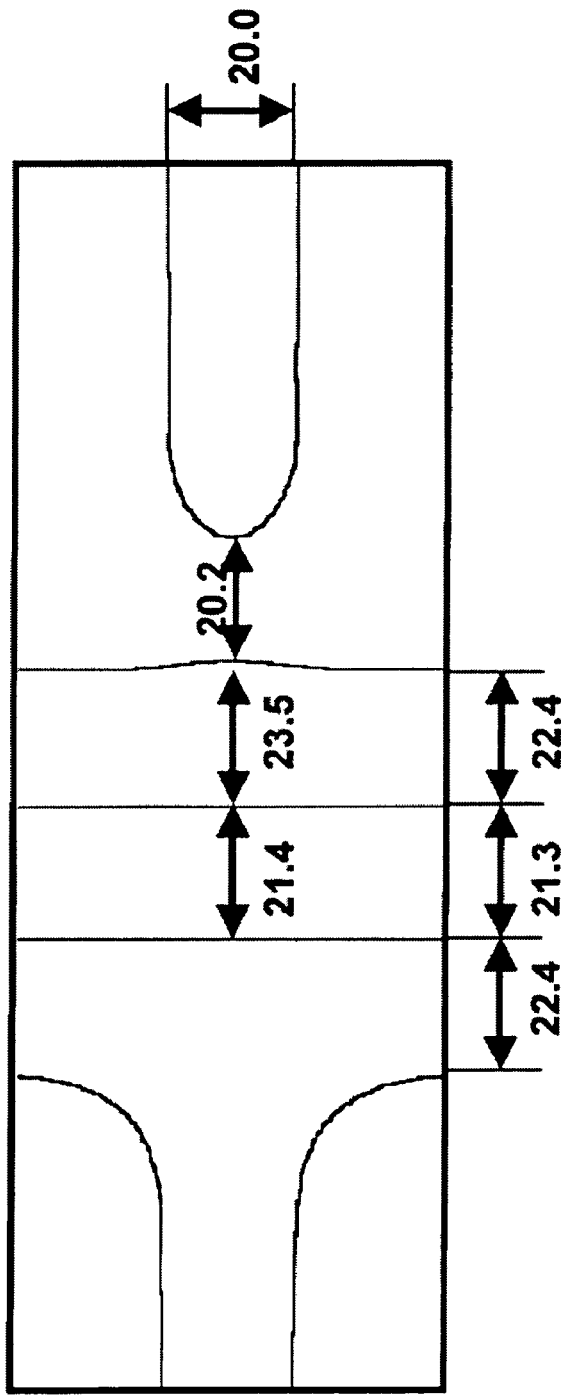
Figure 30A:
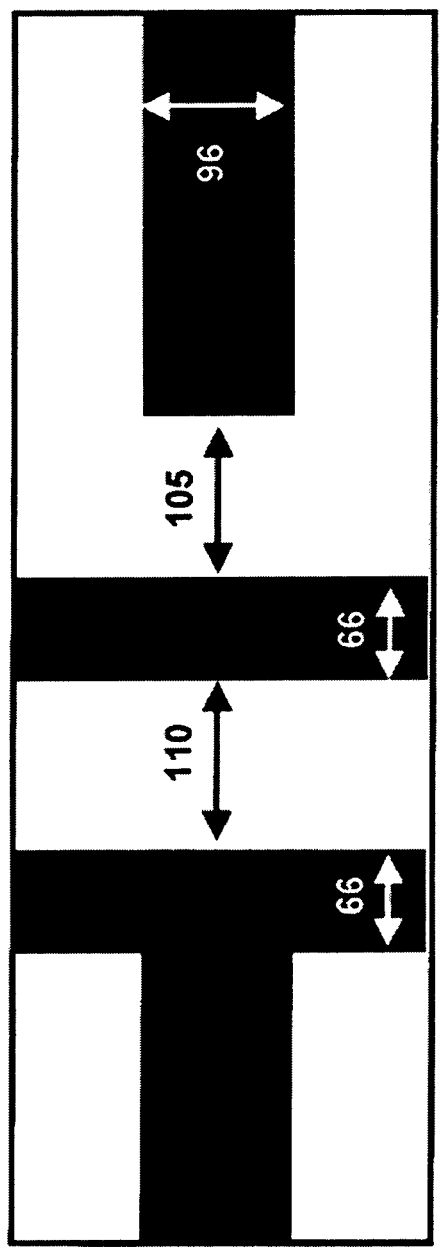
FIG. 30A and FIG. 30B are schematic diagrams describing specific examples of a corrected mask pattern and a transferred image on the wafer in the case that the mask pattern is corrected so that the fidelity of the transferred image on the wafer corresponding to a confronting portion of the mask is improved.
Figure 30B:
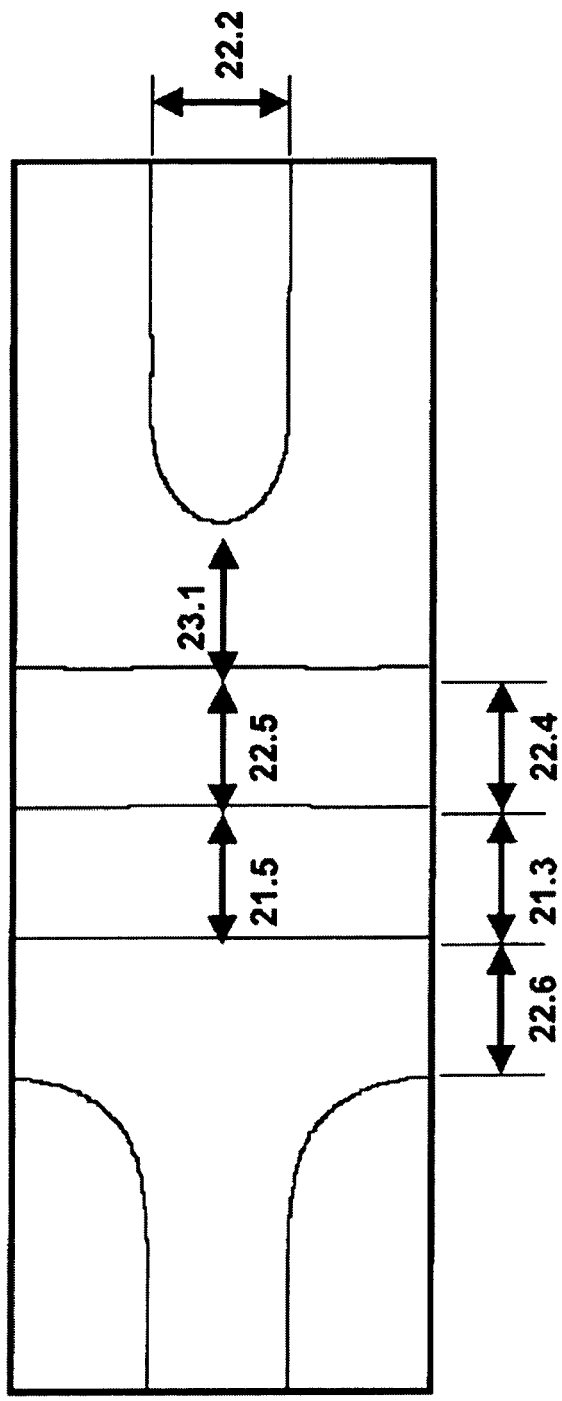

To correct the pattern on the mask, a model pattern thereof is corrected. FIG. 27 is a schematic diagram showing an example of a model pattern. In the model pattern, the exposure light is vertically incident to the front surface of the mask. FIG. 28 is a schematic diagram describing a corrected result of the model pattern shown in FIG. 26, the exposure light being incident to the mask at an incident angle of 7.8°. FIG. 29A and FIG. 29B are schematic diagrams showing a mask pattern corrected with the corrected values shown in FIG. 28 and a result of which the mask pattern is exposed. FIG. 29B clearly shows that when the light is exposed to the wafer with the corrected mask pattern, even if the mask pattern is corrected with a simple model, a transferred image that has been properly corrected can be obtained on the wafer. A confronted portion of the mask shown in FIG. 29A uses values of which the OPC has been performed for a transferred image on the wafer in the case that the exposure light is vertically incident to the front surface of the wafer. FIG. 30A and FIG. 30B are schematic diagrams describing specific examples of a mask pattern that has been corrected and a transferred image on the wafer so that the fidelity of the shape of the transferred image on the wafer corresponding to a confronted portion of the mask is improved.

A further specific example will be described. To almost match the near field energy on the mask to which the exposure light is obliquely incident with that on the mask to which the exposure light is vertically incident, the near field energy on the mask can be obtained as energy per unit area.

Figure 31A:
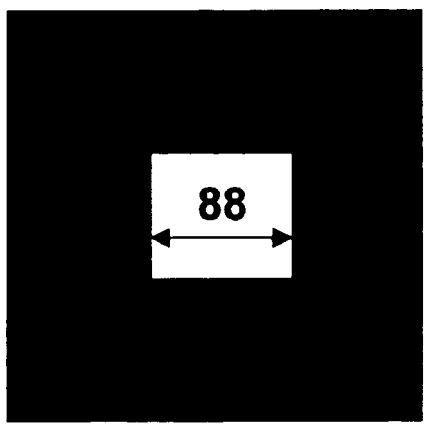
FIG. 31A and FIG. 31B are schematic diagrams describing examples of patterns to be corrected.
Figure 31B:
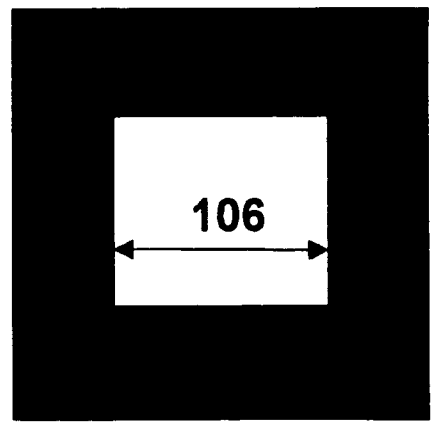

FIG. 31A and FIG. 31B are schematic diagrams describing patterns according to this embodiment. FIG. 31A shows a mask pattern designed so that a hole of 22 nm is formed on a wafer in the case that the exposure light is vertically incident to the mask under the optical conditions of an incident angle of 8.8°, NA=0.30 and σ=0.90. FIG. 31B shows a mask pattern that has been corrected.

Figure 32:
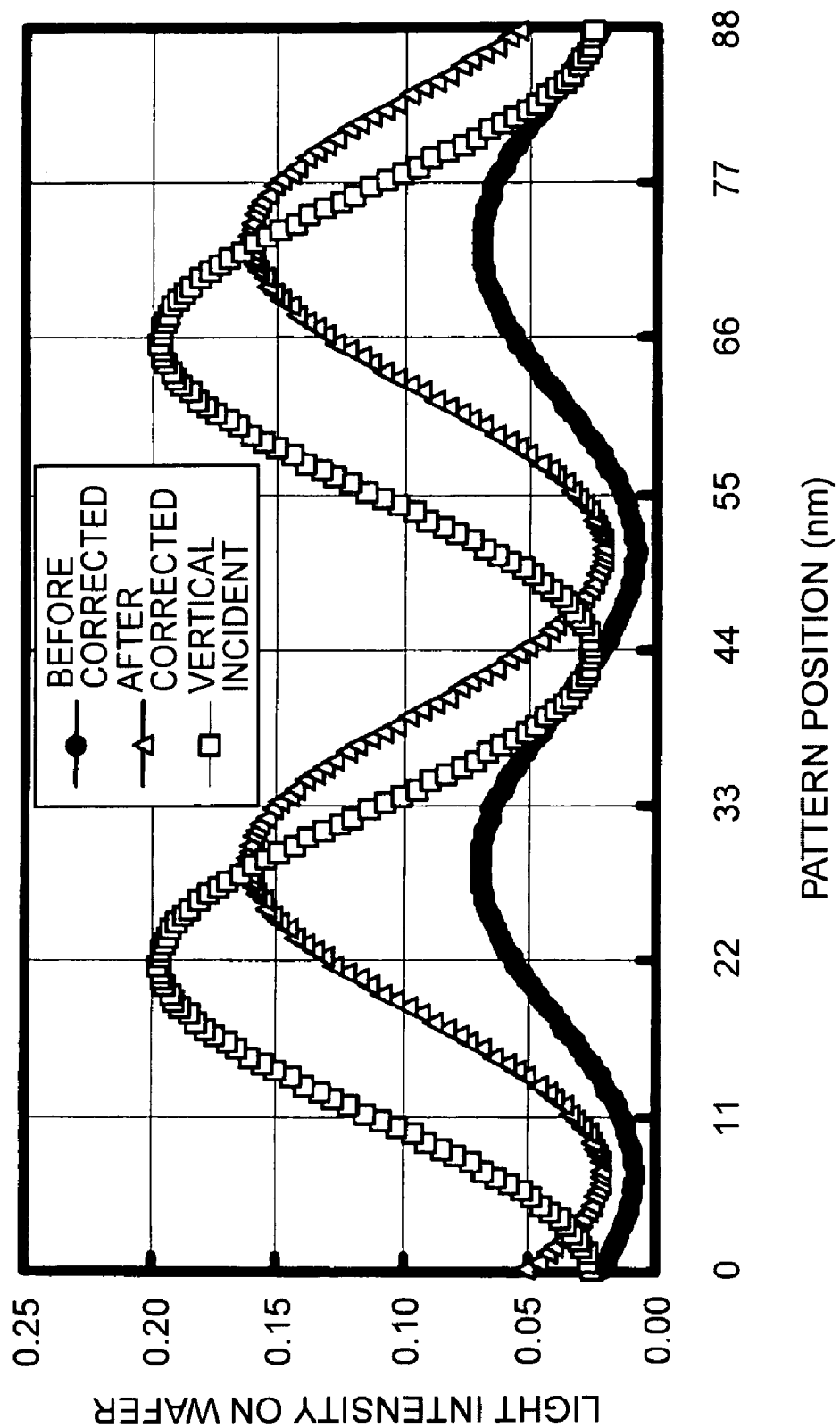
FIG. 32 is a graph describing a specific example of the distribution of the light intensities on the mask in the case that the patterns shown in FIG. 31A and FIG. 31B are exposed.

FIG. 32 is a graph describing a specific example of the distribution of the light intensities on the wafer when the patterns shown in FIG. 31A and FIG. 31B have been corrected. FIG. 32 clearly show that when exposure light is obliquely incident to the front surface of the mask that has been corrected, the light intensity on the mask is the same as that in the case that the exposure light is vertically incident to the mask. On the other hand, the light intensity on the mask with the pattern that has not been corrected is very low.

Figure 33A:
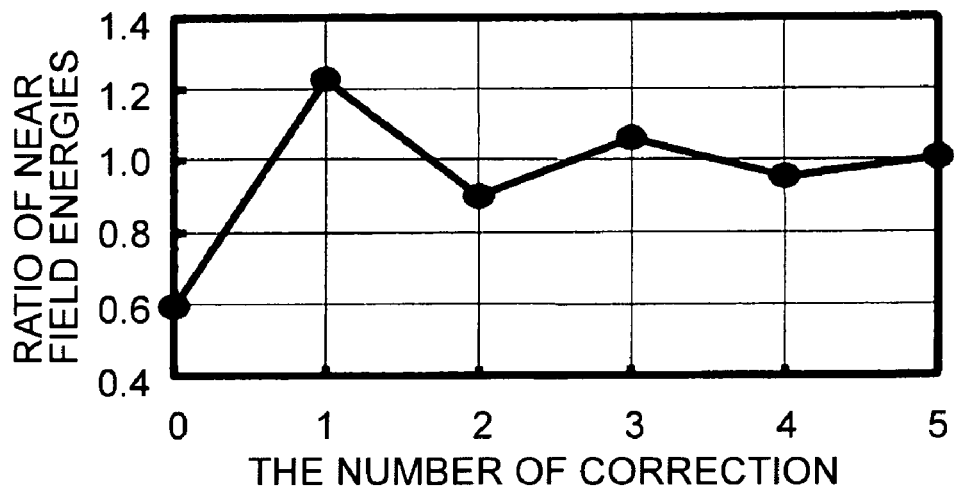
FIG. 33A, FIG. 33B, and FIG. 33C are graphs describing the relation of the ratio ($E_0/E_n$) of the near field energies on the mask, the area of the hole of the mask pattern, and the hole width of the mask pattern corresponding to the number of times the hole pattern is corrected when the exposure light is incident to the mask at an incident angle of 8.8°.
Figure 33B:
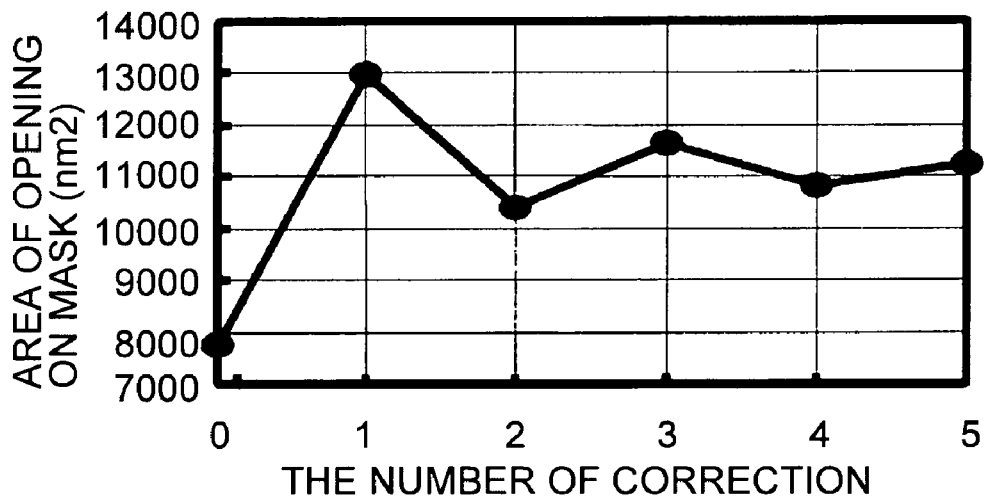
Figure 33C:
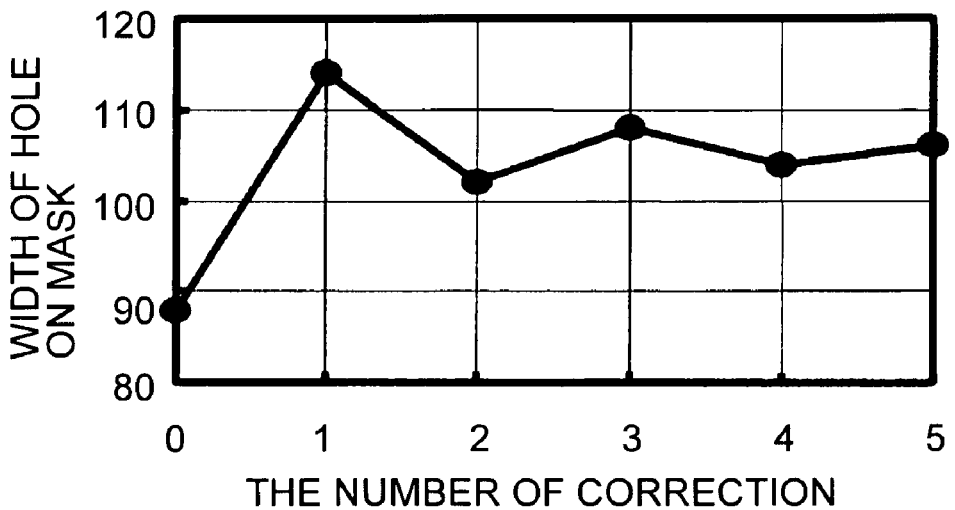

FIG. 33A, FIG. 33B, and FIG. 33C are graphs describing specific examples of the ratio ($E_0/E_n$) of near field energies on the mask, hole area of mask pattern, and hole width of mask pattern corresponding to the number of times the pattern is corrected. FIG. 33A to FIG. 33C show that after the pattern is corrected five times, the near field energy on the mask to which the exposure light is diagonally incident is almost matched with that on the mask to which the exposure light is vertically incident.

Next, another specific example will be described. To almost match the near field energy on the mask to which the exposure light is obliquely incident with that on the mask to which the exposure light is vertically incident, a material having a large extinction coefficient may be selected or the film thickness of an absorption film may be thinned.

Figure 34A:
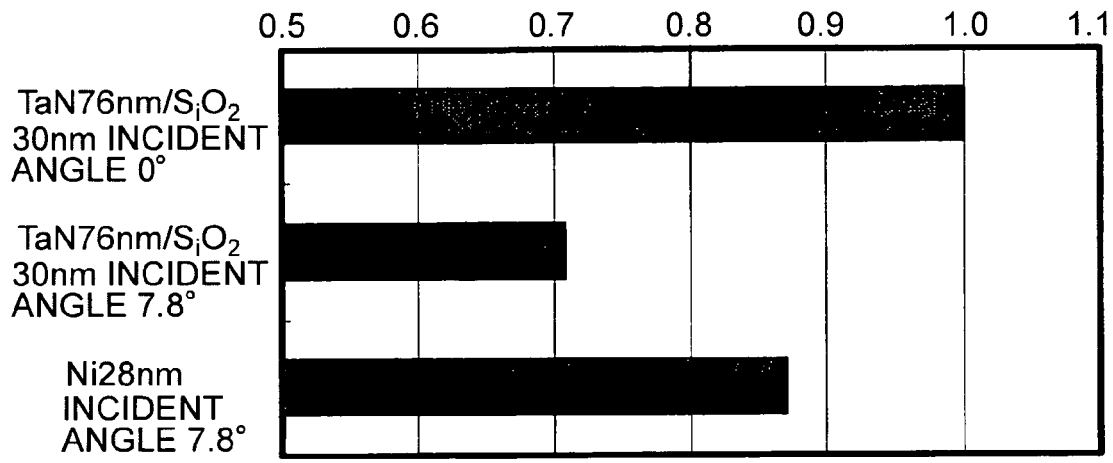
FIG. 34A and FIG. 34B are graphs describing specific examples (No. 1) showing the relation of the near field energy and an extinction coefficient, in particular, the relative ratio of the near field energies of an exposure mask composed of Ni having a thickness of 28 nm (k=0.0727) and an exposure mask composed of TaN having a thickness of 76 nm (k=0.032) and $SiO_2$ having a thickness of 30 nm (k=0.011) (composite extinction coefficient=0.026) that are used to restore the loss of the near field energies on the masks to which the exposure light is incident at an incident angle of 8.8°.
Figure 34B:
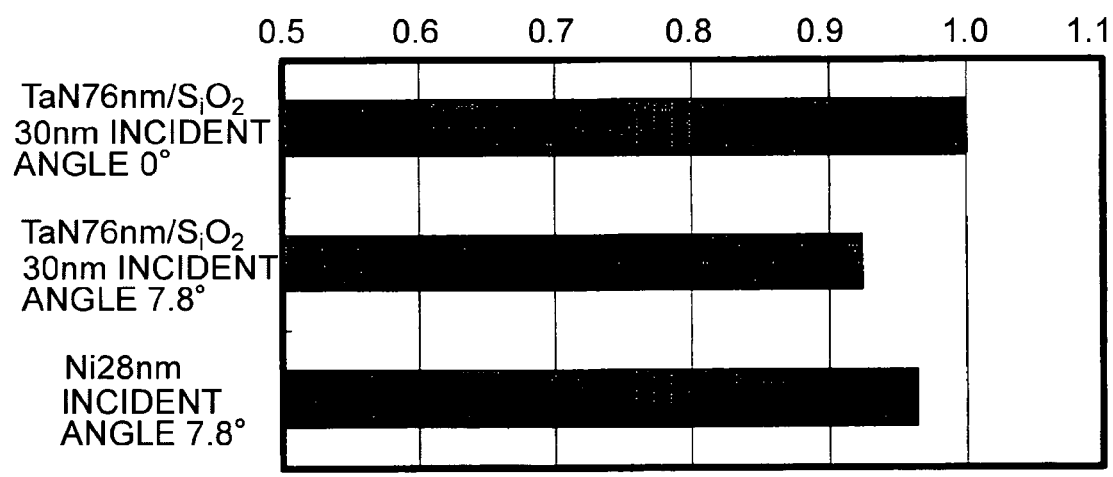
Figures 35A, 35B:
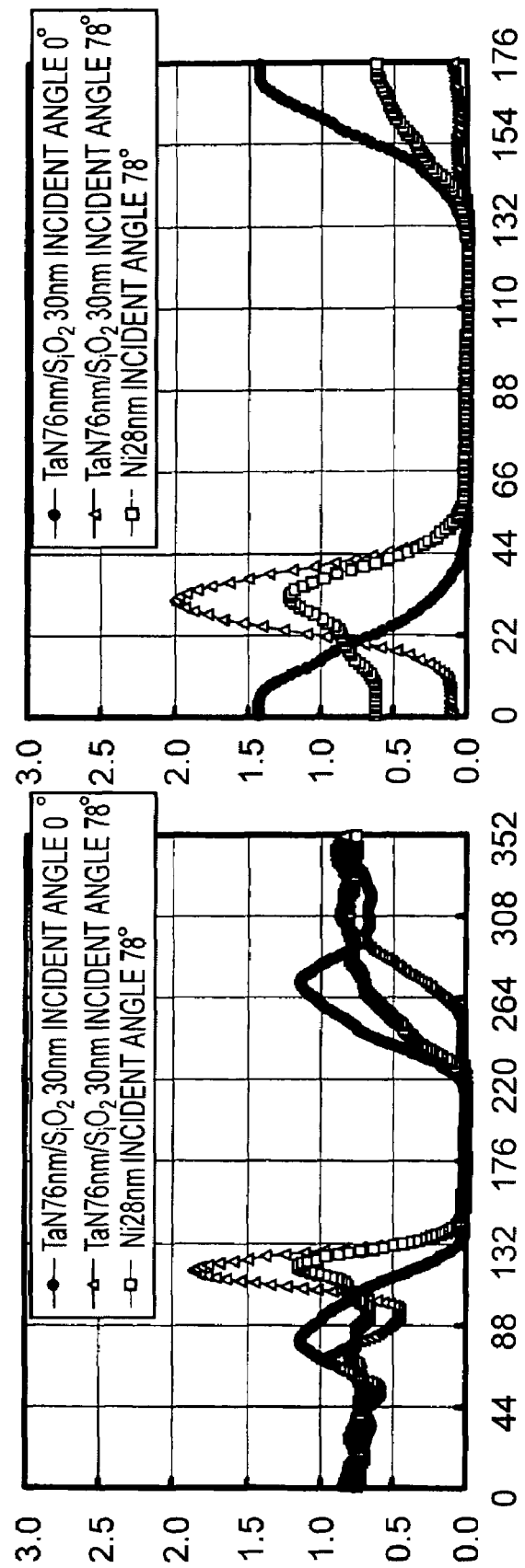
FIGS. 35A and 35B are graphs describing specific examples (No. 2) showing the relation of the near field energy and the extinction coefficient, in particular, the near field light intensity on the mask that represents the improvement of the near field energies of an exposure mask composed of Ni having a thickness of 28 nm (k=0.0727) and an exposure mask composed of TaN having a thickness of 76 nm (k=0.032) and $SiO_2$ having a thickness of 30 nm (k=0.011) (composite extinction coefficient=0.026) that are used to restore the loss of the near field energies on the masks to which the exposure light is incident at an incident angle of 8.8°.
Figure 36A:
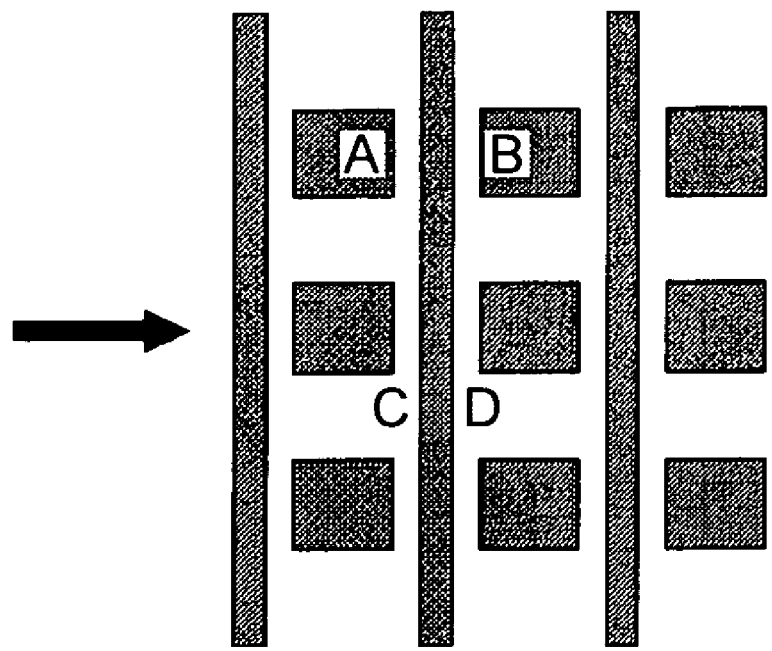
FIG. 36A and FIG. 36B are schematic diagrams showing specific examples of the relation of a projection vector of the incident light and a pattern layout.
Figure 36B:
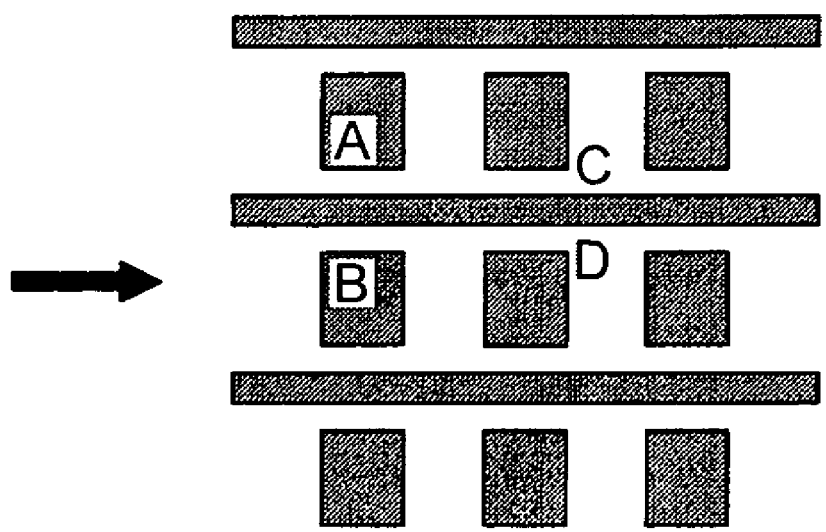

FIG. 34A, FIG. 34B, FIG. 35A, and FIG. 35B are graphs describing specific examples of compared results of the near field energies depending on extinction coefficients. FIG. 34A and FIG. 34B show the compared results of the near field energy of the mask that uses an absorber film made of Ni and having an extinction coefficient of 0.0727 and a thickness of 28 nm and that of the mask that uses a multi-layer film of an absorber film made of TaN and having a thickness of 76 nm and a buffer film made of $SiO_2$ and having a thickness of 30 nm. FIG. 35A and FIG. 35B show that near field light intensities on the masks represent that the near field energies on the mask are improved in the same conditions as the conditions shown in FIG. 34A and FIG. 34B. The compared result represents that the near field energy on the mask is largely improved from energy (reference energy) of the exposure light that is vertically incident to the mask composed of a TaN absorber film having a thickness of 76 nm and a $SiO_2$ buffer film having a thickness of 30 nm. In particular, the ratio $(E_0/E_n)$ of the near field energies of a 4× mask having a pitch of 176 nm and composed of a TaN absorber file having a thickness of 176 nm and a $SiO_2$ buffer film having a thickness of 30 nm is 0.71, whereas the ratio of the near field energies of the mask composed of a Ni absorption film having a thickness of 28 nm is improved to 0.87.

In the foregoing first to fourth examples, the near field energy of the exposure light that is vertically incident to a mask is used as a reference value. Alternatively, the near field energy of the exposure light that can be considered that it is vertically incident to the mask can be used as a reference value as well as the exposure light that is vertically incident to the mask. For example, in FIG. 10A and FIG. 10B, the near field energy of the exposure light that is incident to the mask at an incident angle of 5° or smaller can be used as a reference value because the near field energy is not largely decreased in comparison with the near field energy of the exposure light that is vertically incident to the mask.

What is claimed is:

1. A method for correcting an image corresponding to a mask pattern, said image resulting from obliquely illuminating a front surface of a reflective exposure mask with extreme ultraviolet light (EUV), said method comprising:
    a step of obtaining a light energy $E_0$ reflected from the exposure mask when the EUV is substantially normal to the front surface of the exposure mask;
    a step of obtaining a light energy $E_1$ reflected from the exposure mask when the EUV is obliquely incident to the front surface of the exposure mask; and
    a step of correcting the image corresponding to the mask pattern in accordance with a compared result of the light energies $E_0$ and $E_1$, wherein:
    the front surface of the exposure mask comprises a mask blank film for reflecting the EUV and an absorber film patterned on the mask blank film for absorbing the EUV; and
    an exposure mask feature is corrected whereby the energy $E_1$ approximately equals the energy $E_0$.

2. The method of claim 1, wherein at least one of said energy $E_0$ and said energy $E_1$ is an energy of a near field light obtained by reflecting the EUV.

3. The method of claim 1, wherein at least one of said energy $E_0$ and said energy $E_1$ is an energy of a light obtained at a distance from a surface of the absorber film, said distance being within a range of twice the wavelength of the EUV.

4. The method of claim 1, wherein the corrected exposure mask feature comprises the mask pattern.

5. The method of claim 1, wherein the corrected exposure mask comprises a film thickness of the absorber film.

6. The method of claim 1, wherein the corrected exposure mask feature comprises a material property of the absorber film.

7. The method of claim 1, wherein a step of correcting for an optical proximity effect is carried out prior to said step of obtaining the energy $E_0$.

8. The method of claim 1, wherein at least one of the energy $E_0$ and the energy $E_1$ is obtained by simulation.

9. A method for producing a reflective exposure mask having a mask pattern, said exposure mask being adapted to produce an image corresponding to the mask pattern, said image resulting from obliquely illuminating a front surface of the reflective exposure mask with extreme ultraviolet light (EUV), said method comprising:
    a step of obtaining a light energy $E_0$ reflected from the exposure mask when the EUV is substantially normal to the front surface of the exposure mask;
    a step of obtaining a light energy $E_1$ reflected from the exposure mask when the EUV is obliquely incident to the front surface of the exposure mask; and
    a step of correcting a mask pattern in accordance with a compared result of the light energies $E_0$ and $E_1$, wherein:
    the front surface of the exposure mask comprises a mask blank film for reflecting the EUV and an absorber film patterned on the mask blank film for absorbing the EUV; and
    an exposure mask feature is corrected whereby the energy $E_1$ approximately equals the energy $E_0$.

10. A method for fabricating a semiconductor device by exposing a desired pattern onto a wafer in a lithography process, wherein a reflective exposure mask having a mask pattern produces an image corresponding to the mask pattern, said image resulting from obliquely illuminating a front surface of the reflective exposure mask with extreme ultraviolet light (EUV), the method comprising:
    a step of obtaining a light energy $E_0$ reflected from the exposure mask when the EUV is substantially normal to the front surface of the exposure mask;
    a step of obtaining a light energy $E_1$ reflected from the exposure mask when the EUV is obliquely incident to the front surface of the exposure mask;
    a step of correcting the mask pattern in accordance with a compared result of the light energies $E_0$ and $E_1$; and
    exposing the semiconductor device using the exposure mask with the corrected mask pattern; wherein
    the front surface of the exposure mask comprises a mask blank film for reflecting the EUV and an absorber film patterned on the mask blank film for absorbing the EUV; and
    an exposure mask feature is corrected whereby the energy $E_1$ approximately equals the energy $E_0$.

11. The method of claim 10, wherein at least one of said energy $E_0$ and said energy $E_1$ is an energy of a near field light obtained by reflecting the EUV.

12. The method of claim 1, wherein at least one of said energy $E_0$ and said energy $E_1$ is an energy of a light obtained at a distance from a surface of the absorber film, said distance being within a range of twice the wavelength of the EUV.

13. The method of claim 1, wherein the corrected exposure mask feature comprises the mask pattern.

14. The method of claim 1, wherein the corrected exposure mask feature comprises a film thickness of the absorber film.

15. The method of claim 1, wherein the corrected exposure mask feature comprises a material property of the absorber.

16. The method of claim 1, wherein a step of correcting for an optical proximity effect is carried out prior to said step of obtaining the energy $E_0$.

17. The method of claim 1, wherein at least one of the energy $E_0$ and the energy $E_1$ is obtained by simulation.

18. The method of claim 10, wherein the mask pattern is corrected by changing at least one of a pattern size and a pattern position.

19. The method of claim 4, wherein the mask pattern is corrected by changing at least one of a pattern size and a pattern position.

* * * * *